United States Patent [19]
Utsumi et al.

[11] Patent Number: 5,766,783
[45] Date of Patent: Jun. 16, 1998

[54] BORON-ALUMINUM NITRIDE COATING AND METHOD OF PRODUCING SAME

[75] Inventors: Yoshiharu Utsumi; Takahiro Imai; Naoji Fujimori, all of Itami, Japan

[73] Assignee: Sumitomo Electric Industries Ltd., Osaka, Japan

[21] Appl. No.: 565,027

[22] Filed: Nov. 30, 1995

[30] Foreign Application Priority Data

Mar. 1, 1995 [JP] Japan ................... 7-041687
Oct. 30, 1995 [JP] Japan ................... 7-306899

[51] Int. Cl.$^6$ ................... B32B 17/00
[52] U.S. Cl. ................... 428/698; 428/336; 428/432; 428/446; 428/697; 428/700; 428/701; 428/702
[58] Field of Search ................... 428/446, 697, 428/698, 700, 701, 702, 336, 432

[56] References Cited

U.S. PATENT DOCUMENTS

| | | | |
|---|---|---|---|
| 3,922,475 | 11/1975 | Manasevit | 428/700 |
| 4,731,303 | 3/1988 | Hirano et al. | 428/700 |
| 4,892,791 | 1/1990 | Watanabe | 428/698 |
| 5,503,912 | 4/1996 | Setoyama et al. | 428/698 |
| 5,571,603 | 11/1996 | Utumi | 428/698 |

*Primary Examiner*—Timothy Speer
*Attorney, Agent, or Firm*—Pillsbury Madison & Sutro LLP

[57] ABSTRACT

Boron-aluminum nitride $B_xAl_{1-x}N_y$ ($0.001 \leq x \leq 0.70$, $0.85 \leq y \leq 1.05$) films having wurtzite type structure are proposed. The material has higher hardness, higher sound velocity and wider band gap than hexagonal aluminum nitride (AlN).

33 Claims, 6 Drawing Sheets

WURTZITE TYPE

Fig.2   ZINC BLENDE TYPE
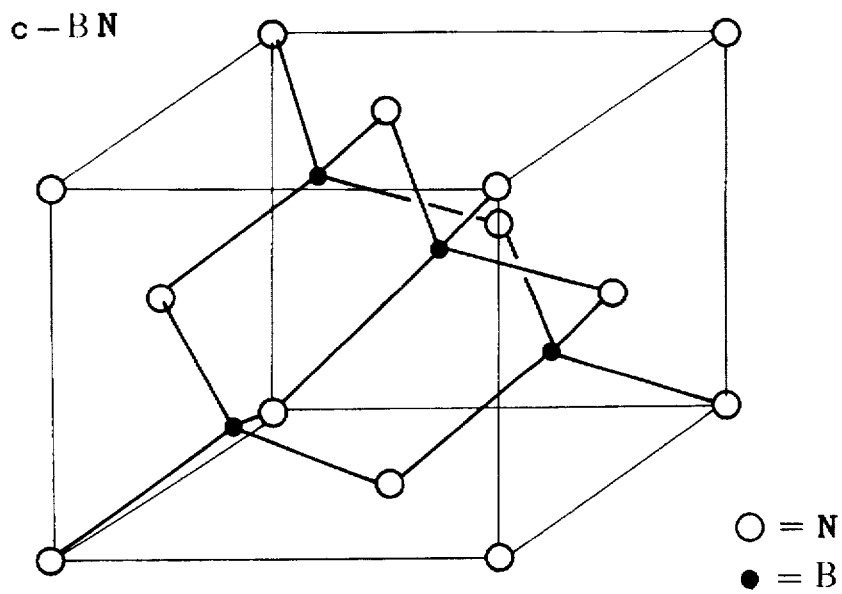
Fig.3
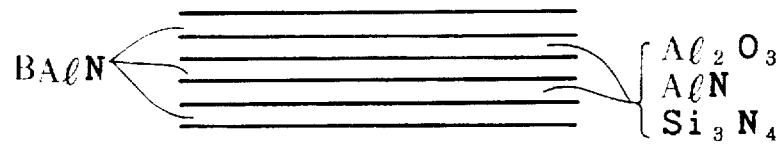
Fig.4
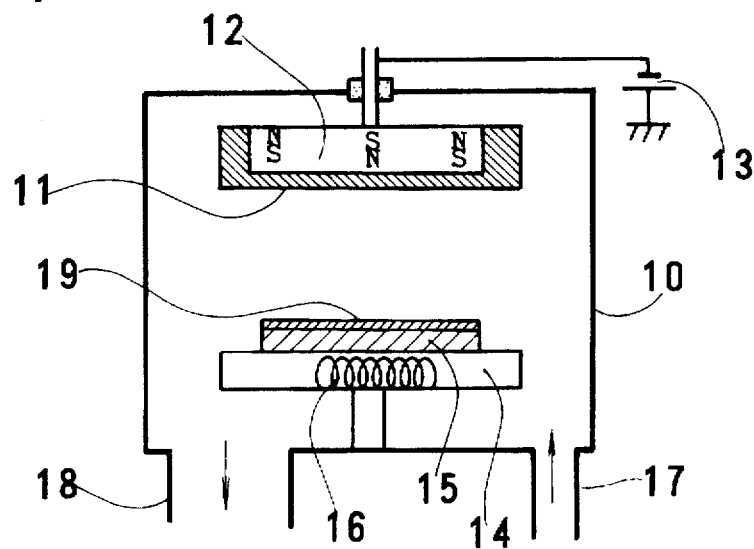

BORON-ALUMINUM NITRIDE COATING AND METHOD OF PRODUCING SAME

FIELD OF THE INVENTION

This invention relates to a boron-containing aluminum nitride coating which is utilized for tools, abrasive-resistant parts, surface acoustic wave devices, light emitting devices, high thermal conductive heat sinks or the like.

BACKGROUND OF THE INVENTION

This invention claims priorities based on Japanese Patent Application No. 41687/1995 filed Mar. 1, 1995 and Japanese Patent Application No.(unknown)/1995 filed Oct. 30, 1995. Boron nitride (BN) and aluminum nitride (AlN) which excel in hardness do not exist in the natural world. Since BN and AlN are not be mined as natural resources, BN and AlN must be artificially synthesized. The technology of making BN crystals or AlN crystals is not matured yet. The synthesis of powder or thin films of BN and AlN has been tried.

Aluminum nitride (AlN) has a crystal structure of the wurtzite (ZnS) type belonging to the hexagonal symmetry. AlN is endowed with high hardness, a high sound velocity and a wide band gap. Now AlN is produced in the form of powder, sintered matter made from the powder, and thin films. No bulk AlN single crystal can be produced yet. The impossibility of making a large bulk has forced the manufacturers to make oriented AlN thin films. The thin films of AlN have been applied as a material to tools, high frequency surface acoustic wave filters, or short wavelength light sources.

Boron nitride (BN) can take two phases of a low pressure phase and a high pressure phase according to the conditions of synthesis. The low pressure phase has further several sub-phases. A hexagonal symmetry BN which couples nitrogen atoms and boron atoms by $sp^2$-hybridization orbits is the mainstream of the low pressure phase of BN. "hybridization orbit" is a concept of the orbits which indicate the covalent bonds in valence atoms. Originally, the hybridization was contrived for explaining the covalent bonds of carbon atoms. The $sp^2$-hybridization means the three orbits $\Phi_1$, $\Phi_2$ and $\Phi_3$ which are built with a 2s-wave function (2s) and two 2p-wave functions $(2p_x)$ and $(2p_y)$. FIG. 7 shows the $sp^2$-hybridization.

$\Phi_1 = (1/3)^{1/2}(2s) + (2/3)^{1/2}(2p_x)$ $\Phi_2 = (1/3)^{1/2}(2s) - (1/6)^{1/2}(2p_x) + (1/2)^{1/2}(2p_y)$ $\Phi_3 = (1/3)^{1/2}(2s) - (1/6)^{1/2}(2p_x) - (1/2)^{1/2}(2p_y)$ where (2s) is a wave function of a 2s orbital electron, $(2p_x)$ is a wave function of a $2p_x$ orbital electron and $(2p_y)$ is a wave function of a $2p_y$ orbital electron. The three orbits $\Phi_1$, $\Phi_2$, $\Phi_3$ are included in the same plane and meet with each other at 120 degrees. In the case of carbon compounds, the $sp^2$ hybridization makes for example, graphite, ethylene ($C_2H_4$) or other olefin hydrocarbons $C_nH_{2n}$. The low pressure phase BN (e.g. h-BN) has not a good quality, e.g., in hardness, sound velocity or so. Thus, the low pressure phase BN is not promising.

The high pressure phase has two sub-phases which couple boron atoms with nitrogen atoms by $sp^3$-hybridization orbits $\Psi_1$, $\Psi_2$, $\Psi_3$ and $\Psi_4$ which are demonstrated by FIG. 8. The $sp^3$-hybridization orbits are built with a (2s) orbit and three (2p) orbits.

$\Psi_1 = \{(2s) + (2p_x) + (2p_y) + (2p_z)\}/2$ $\Psi_2 = \{(2s) + (2p_x) - (2p_y) - (2p_z)\}/2$ $\Psi_3 = \{(2s) - (2p_x) + (2p_y) - (2p_z)\}/2$ $\Psi_4 = \{(2s) - (2p_x) - (2p_y) + (2p_z)\}/2$

One of the sub-phases of the high pressure phase BN is a zinc blende type (ZnS) cubic symmetry BN and the other is a wurtzite (ZnS) type hexagonal symmetry BN. FIG. 1 shows a hexagonal lump containing three of unit cells of hexagonal wurtzite type structure. The hatched part of z=0 of FIG. 1 denotes a unit cell. The cubic symmetric BN (c-BN) has a structure of zinc blend type like GaAs, InP or other III–V compound semiconductors. FIG. 2 indicates the cubic zinc blende structure. Both the zinc blende type c-BN and the wurtzite type BN couple boron atoms with nitrogen atoms by spa-hybridization orbits. The structure of the wurtzite type BN is different from the zinc blende type cubic BN. The wurtzite type BN has a very different crystal structure from the h-BN of the low pressure phase, although both BN crystals have hexagonal symmetry. Then the wurtzite type hexagonal symmetric BN will be denoted by w-BN from now for discerning it from c-BN and h-BN.

Small granules or powder of the high pressure phase BN have been produced by the static high pressure method and the explosion-compression method. The crystals of granules or powder, however, were too small to make the tools or the devices on the BN granules. Then a lot of trials have been done for synthesizing wide thin films of the high pressure phase BN without making use of the high pressure crystal growth apparatus. Nobody has succeeded in making wide high pressure phase BN thin films of high quality enough for producing semiconductor devices or high frequency filters with the films yet. Thus, the current technology can make neither bulk single crystal w-BN nor wide thin film w-BN. There is no w-BN except powder.

Japanese Patent laying Open No. 1-232695 suggested composite films including AlN and BN as dielectric layers of thin film EL (electroluminescence) devices. The report said the thin film device had a stable B/V property for a long time even if the EL devices were driven by AC pulses with different phases or by AC pulses with different amplitudes. However, there was no explanation about the crystal structure of the composite films of AlN and BN. Perhaps the films were a mixture of AlN and BN of low pressure phase.

In short, there is neither prior art which can produce a large crystal of wurtzite type AlN nor prior art which can make a large crystal of w-BN. Furthermore, no wide thin film of w-BN has not been synthesized yet.

SUMMARY OF THE INVENTION

One purpose of the present invention is to provide a novel material which can be produced into wide films and has high hardness or other excellent properties superior to AlN.

Another purpose of the present invention is to provide a novel thin film which is endowed with high hardness, a wide band gap and a large sound velocity which are superior to AlN.

Another purpose of the present invention is to provide a thin film having better crystallographical property than BN and better controllability of valence electrons than AlN.

Another purpose of the present invention is to provide a thin-film which can be applied to a material of tools, abrasive-resistant parts, surface acoustic wave devices, light emitting devices and heat sinks.

A further object of the present invention is provide a method of producing novel films which have high hardness, a high sound velocity and a wide band gap.

This invention proposes a new material of boron-containing aluminum nitride which has a wurtzite type structure and has a compound expressed by $B_xAl_{1-x}N_y$ ($0.001 \leq x \leq 0.7$, $0.85 \leq y \leq 1.05$). This material is a solid solution of AlN and BN.

The material comprises boron, aluminum and nitrogen. Sometimes impurity is doped for changing electric property. The material takes hexagonal symmetry of wurtzite type. Furthermore, the material can be expressed by $B_xAl_{1-x}N_y$. The ratio x of boron atoms to the sum of boron and aluminum atoms ranges from 0.001 to 0.7. The other ratio y of nitrogen to the sum of boron and aluminum atoms is between 0.85 and 1.05. This three-component material is a new material.

Further, this invention proposes a thin film of a new material $B_xAl_{1-x}N_y$ ($0.001 \leq x \leq 0.7$, $0.85 \leq y < 1.05$) of hexagonal symmetry of wurtzite type grown on a pertinent substrate. The material of the substrate is aluminum nitride (AlN), diamond (C), silicon (Si), aluminium oxide ($\alpha$-$Al_2O_3$), silicon carbide (SiC) and the like. The thickness of the film shall be arbitrarily determined for the utility. The probable thickness is 1 nm to 50 μm. More suitable thickness is from 10 nm to 30 μm. The films can be used with the substrate for tools, surface acoustic wave devices, or so. Otherwise, the material can be obtained as freestanding films by eliminating the substrates by acid or the like. In the case of freestanding film, the preferable thickness of a $B_xAl_{1-x}N_y$ film is 10 μm to 1 mm.

This invention proposes a method of producing a $B_xAl_{1-x}N_y$ ($0.001 \leq x \leq 0.7$, $0.85 \leq y \leq 1.05$) film by the steps of employing aluminum, boron, aluminum nitride, boron nitride or aluminum-boron alloy as a target, supplying a material gas including nitrogen gas or ammonia gas, sputtering boron atoms, aluminum atoms or both atoms from the target by bombarding it with a material gas, and depositing a film of boron-containing aluminum nitride $B_xAl_{1-x}N_y$ ($0.001 \leq x \leq 0.7$, $0.85 \leq y \leq 1.05$) on a substrate. This method is called a sputtering method from now. If the substrate is one of an aluminum nitride (AlN) single crystal, a diamond single crystal, a silicon (Si) single crystal, a sapphire ($\alpha$-$Al_2O_3$) single crystal and a silicon carbide (SiC) single crystal, the $B_xAl_{1-x}N_y$ film becomes a highly oriented polycrystal or a single crystal.

Further, this invention proposes a method of producing a $B_xAl_{1-x}N_y$ ($0.001 \leq x \leq 0.7$, $0.85 \leq y \leq 1.05$) film by the steps of employing a halide, a hydride, a metalorganic compound or a metal alkoxide containing at least boron and aluminum as a material, diluting the material with hydrogen gas ($H_2$) or a rare gas, supplying the gas containing the material and $N_2$ gas or $NH_3$ gas into a reaction chamber, exciting the gas into plasma, inducing vapor phase reaction in the plasma and depositing a $B_xAl_{1-x}N_y$ ($0.001 \leq x \leq 0.7$, $0.85 \leq y \leq 1.05$) film on a substrate. This method is called a plasma CVD method hereinafter. Here, alkoxide is a compound which is obtained by replacing a hydrogen atom at the hydroxyl group of an alcohol by another element. In this case, the alkoxide is, e.g., $(CH_3O)_3B$, $(CH_3O)_3Al$, $(C_2H_5O)_3Al$ or $(C_2H_5O)_3B$. The halide of B or Al is, e.g., $BF_3$, $BCl_3$, $BI_3$, $AlCl_3$, $AlF_3$, $AlBr_3$ and so forth in the case. The hydride is $(AlH_3)n$, $B_2H_5$, $B_4H_{10}$ and the like. The metalorganic compound of Al or B is, e.g., $(CH_3)_3Al$, $(CH_3)_3B$, $(C_2H_5)_3Al$, $(C_2H_5)_3B$ and the like. The rare gas means He, Ar, Xe, Kr or He.

The boron-including aluminum nitride has a wurtzite type hexagonal structure, if the compound of $B_xAl_{1-x}N_y$ is determined to a scope of $0.001 \leq x \leq 0.7$, $0.85 \leq y \leq 1.05$. The hexagonal $B_xAl_{1-x}N_y$ produced as a film of a substrate by a pertinent method exhibits superb properties, for example, in hardness, sound velocity and band gap.

The hardness of the $B_xAl_{1-x}N_y$ is higher than that of AlN. The sound velocity of the $B_xAl_{1-x}N_y$ is higher than that of AlN. The band gap of $B_xAl_{1-x}N_y$ is wider than AlN.

Further, the $B_xAl_{1-x}N_y$ becomes a highly oriented polycrystal film or a single crystal film, when it is grown on a diamond single crystal substrate, a Si single crystal substrate, an $\alpha$-$Al_2O_3$ single crystal substrate or a SiC single crystal substrate by the sputtering method, the CVD method or the laser ablation method. The quality of the film can be estimated by the full width at the half maximum (FWHM) of the rocking curve in X-ray diffraction measurement. The $B_xAl_{1-x}N_y$ exhibits a narrower full width of the rocking curve of the X-ray diffraction than the c-BN or w-BN. The highly oriented polycrystal or the single crystal $B_xAl_{1-x}N_y$ film is superior to the high pressure phase BN film in the crystallographical property.

Namely, the $B_xAl_{1-x}N_y$ suggested by the present invention for the first time is superior to BN in the crystallography and superior to AlN in the physical properties.

The preferable thickness of the film is 10 nm to 50 μm in the case of being accompanied by a substrate. As mentioned once, the preferable thickness is 10 m to 1 mm in the case of a freestanding film. The $B_xAl_{1-x}N_y$ films can be utilized as a material for tools, abrasive-resistant parts, surface acoustic wave devices, light sources or heat sinks.

BRIEF DESCRIPTION OF THE DRAWINGS

FIG. 2 is a schematic view of a unit cell of the zinc blende type crystal of the cubic symmetry.

FIG. 3 is a multilayered top or intermediate film of an assembly of BAlN films and $Al_2O_3$, AlN, or $Si_3N_4$ films.

FIG. 4 is a schematic sectional view of a magnetron sputtering apparatus.

DETAILED DESCRIPTION OF PREFERRED EMBODIMENTS

Figure 1:
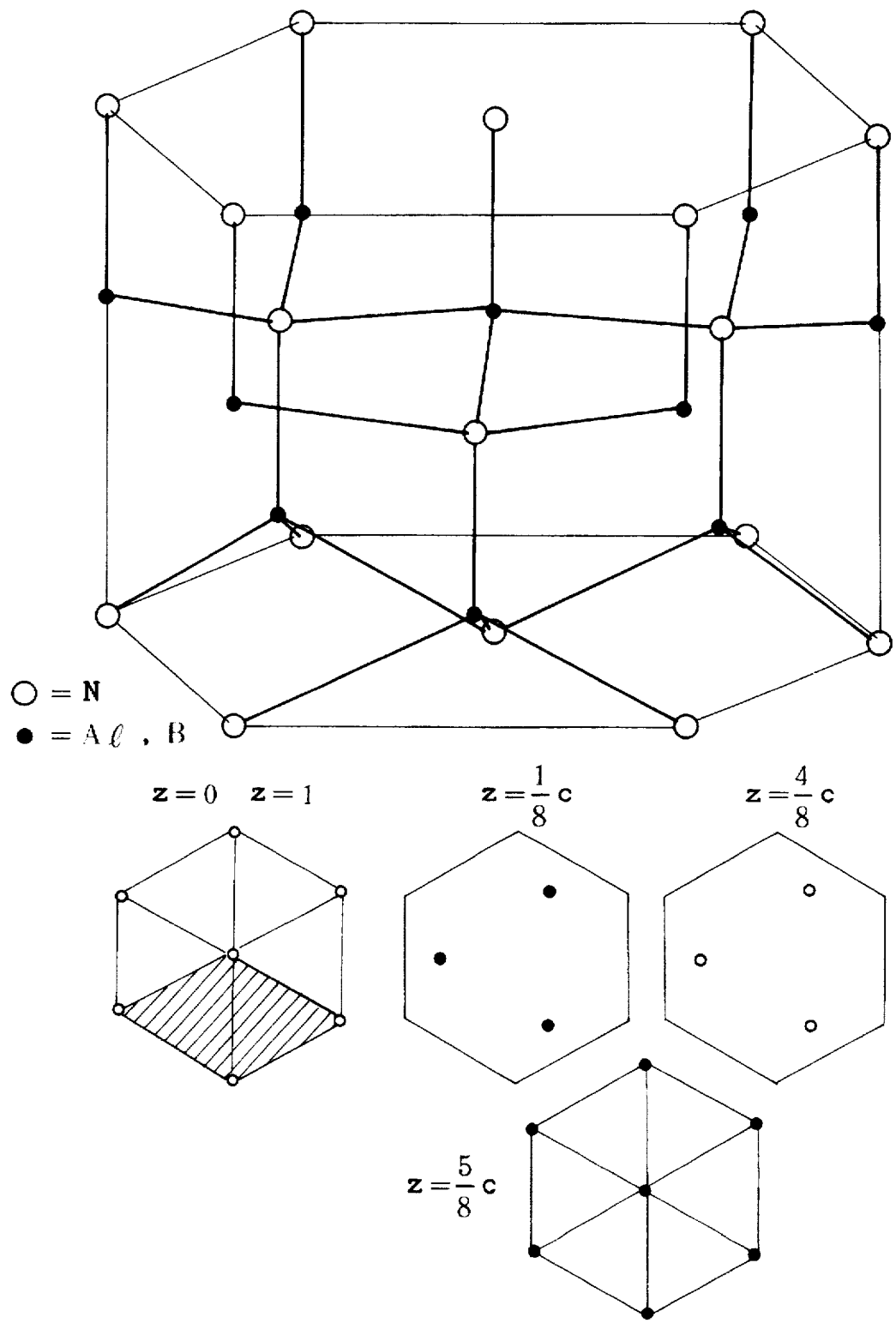
FIG. 1 is a schematic view of a hexagonal lump containing three unit cells of the wurtzite type crystal of the hexagonal symmetry.

The Inventors of the present invention have succeeded in synthesizing a solid solution of boron nitride BN and aluminum nitride AlN. The new material can be expressed as B$_x$Al$_{1-x}$N$_y$, where x is a parameter of determining the ratio of the number of boron atoms to a sum of boron atoms and aluminum atoms and "y" is a ratio of the number of nitrogen atoms to a sum of boron and aluminum atoms. The film can be represented simply as "BAlN" by omitting the parameters. The new material can be named boron-containing aluminum nitride or boron-aluminum nitrogen. These two names will be used as an equivalent.

A number of experiments have been repeated for examining the properties of the artificially made material B$_x$Al$_{1-x}$N$_y$ and for establishing the method of producing wide film of B$_x$Al$_{1-x}$N$_y$ on a pertinent substrate. Then, the facts have been found that the solid solution crystal of BN and AlN is superior to wurtzite type BN in crystallographical properties and superior to wurtzite type AlN in physical and electrical properties. Since the boron-aluminum nitride is a novel material, methods of production, ranges of parameters, kinds of substrates, kinds of intermediate layers, control of valence electrons will be explained.

[1. METHOD OF PRODUCTION OF THE FILMS (PROCESS, MATERIALS, TEMPERATURE)]

Molecular nitrogen is so stable and so inactive that it is difficult for molecular nitrogen to react with aluminum atoms or boron atoms for making a boron-aluminum nitrogen film. Thus, the intake of nitrogen into aluminum or boron requires either a high partial nitrogen pressure or an active state of nitrogen. The production of high quality films demands a low pressure atmosphere, that is, of a total pressure less than 0.1 atm (10$^4$Pa). Thus, active nitrogen should be employed for the vapor phase synthesis of the boron-aluminum nitride of the present invention. The active nitrogen means atomic nitrogen and plasma nitrogen. The preferable method is the sputtering method, the plasma CVD method, the ion plating method or the laser ablation method, because these methods can produce high density of atomic nitrogen and plasma nitrogen. Preferably, the substrate temperature should be higher than 700° C. The substrate is sometimes heated by the bombardment of the plasma or sputtering atoms.

[2. RATIOS OF THE COMPONENTS]

The preferable ratios of the components in the boron-aluminum nitride film are determined by the desired functions and the desired crystallographical properties. In the boron-aluminum nitride B$_x$Al$_{1-x}$N$_y$, "x" is the ratio of the number of boron atoms to the sum of boron and aluminum atoms and "y" is the ratio of the number of nitrogen to the sum of aluminum and boron atoms. The crystallographical property of the B$_x$Al$_{1-x}$N$_y$ is as high as an AlN film for the range of $0.001 \leq x \leq 0.2$. In the range of $x \leq 0.001$, the B$_x$Al$_{1-x}$N$_y$ films have little advantage over AlN, because the physical properties of B$_x$Al$_{1-x}$N$_y$ ($x \leq 0.001$) films are similar to that of AlN films. On the contrary, if x exceeds 0.2, the crystallographical property of the synthesized B$_x$Al$_{1-x}$N$_y$ begins to degrade. Thus, the optimum scope of x ranges from 0.001 to 0.2. The crystallographical property declines between x=0.2 and x=0.7. The degree of degeneration depends on the substrate. When x is larger than 0.7, the crystallographical property seriously damaged. The films (x>0.7) are useless owing to the bad lattice structure. An adoption of a pertinent single crystal substrate enables the B$_x$Al$_{1-x}$N$_y$ film to become a single crystal on the substrate. However, the range is only $x \leq 0.2$ for making a good B$_x$Al$_{1-x}$N$_y$ single crystal, when the B$_x$Al$_{1-x}$N$_y$ film is directly deposited on the single crystal substrate without an intermediate layer.

If a single crystal intermediate layer of AlN or BAlN is deposited on a single crystal substrate and a BAlN film is grown on the intermediate layer, the optimum range of x can be enlarged to x=0.3 due to the relaxation of distortion. Thus the optimum scope is widened to 0.001<x<0.3 by the insertion of the intermediate films of AlN. The range of making a single crystal BAlN is raised further up to $x \leq 0.7$ by inserting a first intermediate layer of AlN and a second intermediate, gradient-component BAlN layer. The gradient component BAlN film contains plural layers having stepwise or continually changing boron component. The parameter x of B$_x$Al$_{1-x}$N$_y$ ($0.0001 \leq x \leq 0.7$, $0.85 < y \leq 1.05$) increases from the bottom layer to the next highest layer in the intermediate film. For example, x=0 at the bottom layer in contact with the substrate and x=x$_0$ at the next highest layer, where x$_0$ is the value of x in the top B$_{x0}$Al$_{1-x0}$N$_y$ film. Intermediate films will again be explained later.

Regarding the other parameter "y", y=1 may be considered as the most suitable ratio for enhancing the crystal property of B$_x$Al$_{1-x}$N$_y$, because y=1 gives a stoichiometric ratio between the group III elements (B and Al) and group V element (N). The investigation of the Inventors revealed that the B$_x$Al$_{1-x}$N$_y$ films enjoy high crystallographical property enough to satisfy the requirements of the hardness, the high sound velocity or the wide band gap in the range between y=0.85 and y=1.05. The ratios of y <0.85 or y>1.05 induce lots of defects and disorder in the B$_x$Al$_{1-x}$N$_y$ films. Thus, preferable ranges of x and y are $0.001 \leq x \leq 0.7$ and $0.85 \leq y \leq 1.05$. The optimum range is $0.001 \leq x \leq 0.2$ for a single BAlN film directly deposited on a single crystal substrate. Otherwise the optimum range is enlarged to $0.001 \leq x \leq 0.3$ by an insertion of AlN single crystal intermediate films.

In the description, "single crystal" means that crystal grains have the same orientations in all directions. Sometimes island crystals grow on a substrate and grain boundaries exist between grains. In such a case, the crystal in which almost all the grains have the same orientations is defined as a "single crystal".

[3. THICKNESS]

With regard to the thickness of BAlN films, a preferable scope of the thickness ranges from 10 nm to 50 μm in the case of dependent films. The films of a thickness less than 1 nm cannot exhibit practical effects for the tools or other devices which require some hardness and rigidity. On the contrary, the films of a thickness more than 50 A m suffer from bad crystallographical property. More suitable thickness ranges from 10 nm to 30 μm. This is the range for dependent films which are supported by their own substrates. Inner stress is generated between the film and the substrate. A selection of a substrate will enable to make a BAlN coating thicker than 50 μm.

Of course, the films can be separated from the substrate by solving or polishing the substrate away. Such freestanding BAlN films can be also applied to a material of tools or devices.

The upper limit of the film thickness is also 1 mm in the case of the freestanding films, because the upper extremity is heightened by the relaxation of the inner stress owing to the elimination of the substrate. By contrast, the lower limit of the freestanding films should be determined from the requirements of the devices. A certain thickness, e.g. 10 μm, would be a requisite for keeping the shape of the films.

[4. SUBSTRATE]

Since the BAlN of the present invention is synthesized by the reactions in vapor phase, a substrate is necessary. The substrate can be made with any materials which are enough resistant to the hot environments of more than 700° C. in which the BAlN films are synthesized, when polycrystalline BAlN films are made. The materials which are inert to B, Al and N are preferable for the substrate. For example, suitable metals for the substrate are molybdenum (Mo), tungsten (W), nickel (Ni), tantalum (Ta) and niobium (Nb). Suitable semiconductors for the substrate are, e.g., diamond (C), silicon (Si), germanium (Ge), aluminum nitride (AlN), silicon carbide (SIC), gallium nitride (GaN), boron phosphide (BP) and indium nitride (InN). Pertinent other compounds are, e.g., aluminum oxide ($Al_2O_3$), silicon carbide (SiC), silicon nitride ($Si_3N_4$), silicon dioxide ($SiO_2$), magnesium oxide (MgO), beryllium oxide (BeO) or zinc oxide (ZnO). Suitable cemented carbides are, e.g., tungsten carbide based ones (WC—Co, WC—TaC—Co, WC—TiC—Co or WC—TiC—TaC—Co).

Selection of the substrate enables this invention to produce oriented polycrystalline BAlN films or single crystal BAlN films. Here "oriented polycrystal" indicates an ordered polycrystal in which almost all the grains align in a certain crystal orientation in the direction vertical to the surface.

For the purpose, the substrate itself must be a single crystal or an oriented polycrystal which makes the BAlN film align in coincidence with the orientation of the substrate. Suitable materials for the object are aluminum nitride (AlN), α-aluminium oxide (sapphire: $\alpha\text{-}Al_2O_3$), silicon carbide (SiC), diamond(C), silicon (Si) or magnesium oxide ((MgO) of single crystal.

In the case of single crystal substrates, the most suitable orientation of the surface is a plane which has either three-fold rotation symmetry or six-fold rotation symmetry, because the three- or six-fold rotation symmetry facilitates growing crystal granules to align in the orientation of c-plane in parallel with the three- or six-fold symmetric surface. The reason is that the c-plane of a hexagonal symmetric crystal has three- or six-fold symmetry and the commonality of the symmetry makes the c-plane orientation easier than other orientations. Such planes are, e.g., a diamond (111) plane, a silicon (111) plane, a cubic silicon carbide (c-SiC) (111) plane, a magnesium oxide (MgO) (111) plane, an $\alpha\text{-}Al_2O_3$ (0001) plane, a hexagonal silicon carbide (h-SiC) (0001) plane(c-plane) and the like. The BAlN films can be directly grown on the substrates. Otherwise, the BAlN films can also be deposited on intermediate layers which have been formed on substrates. There are three kinds of intermediate layers. One kind is a single intermediate one. A second one is a plurality of layers of different materials. A third one is a series of layers of similar mixtures with stepwise or continually changing component ratios.

[5. INTERMEDIATE LAYERS]

An addition of intermediate layers between the substrate and the BAlN film sometimes improves the crystal property of the BAlN films. Pertinent intermediate materials are, for example, AlN, BAlN, $Al_2O_3$, SiC, TiN, TiC, BP, GaN or ZnO. Selection of intermediate layers depends on the material of the substrate. In this case, the product has a three-fold structure having a substrate, a single or a plurality of intermediate layers and a BAlN top layer.

AlN and $Al_2O_3$ are excellent for the material of the intermediate layer in the case of a cemented carbide substrate. The five candidates AlN, SiC, BP, GaN and ZnO have a medium lattice constant between silicon and BAlN. The insertion of the intermediate layer of AlN, SiC, BP, GaN or ZnO is effective in the case that BAlN single crystal film is made on a silicon single crystal substrate because of the alleviation of the lattice misfit by the intermediate layer. The single crystal intermediate layer heightens the quality of BAlN single crystal films by reducing the defects or the distortion in the BAlN films. The addition of the single crystal intermediate layers is advantageous also for other single crystal substrate materials than silicon. The most suitable intermediate single crystal layer is an AlN layer and a BAlN layer. The next preferable one is SiC. BP, GaN and ZnO are inferior to AlN, BAlN and SIC as a material of the intermediate layers.

Single crystal BAlN is a special one among the candidates of the intermediate layers. Here, the intermediate "BAlN" means an assembly of $B_xAl_{1-x}N_y$ layers having gradient changing components. For example, the boron ratio x changes from x=0 at the bottom layer to $x=x_0$ at the next-highest layer in the gradient composition BAlN intermediate layers, where $x_0$ is the x-value of the top $B_{x0}Al_{1-x0}N_y$ film. The value x can be changed in the direction of thickness either stepwise or continuously.

The optimum range of the thickness of the intermediate layer is from 1 nm to 1 μm. An intermediate layer of a thickness less than 1 nm is useless, since the layer is too thin to reduce the lattice misfit for decreasing the defects or the distortion. By contrast, an intermediate layer of a thickness more than 1 μm degrades the crystal property by increasing the distortion and the defects.

Intermediate films can be produced by the sputtering method, the molecular beam epitaxy method (MBE), the metalorganic chemical vapor deposition method (MOCVD), or the plasma CVD method (PCVD). The MBE method enables to make the gradient composition BAlN single crystal intermediate layers by preparing two independent K-cells for boron (B) and for Aluminum (Al), evaporating boron and aluminum and changing the speeds of evaporation of B and Al continually or stepwise. Gradient composition single crystal BAlN films can be made by the plasma CVD method or the MOCVD method by a gradual change of gas flux of a boron-containing gas and an aluminum-containing gas.

[6. CONTROL OF VALENCE ELECTRONS OR CONTROL OF CONDUCTIVE TYPES]

The BAlN films are insulator with high resistivity, if no impurity is doped. The conductive type of the BAlN films can be controlled by doping pertinent impurities. N-type BAlN films can be obtained by doping the BAlN films with silicon (Si), carbon (C), sulfur (S) or selenium (Se) together with the film materials during the growth or after the growth by the ion implantation method. Si, C, S and Se act as n-type impurity in the BAlN films. Namely, these impurity atoms bestow extra electrons in the conduction bands of the BAlN crystal.

Similarly, p-type BAlN films can be produced by doping the films with beryllium (Be), magnesium (Mg), zinc (Zn) or calcium (Ca) together with the film materials during the growth or after the growth by the ion implantation method. Be, Mg, Zn and Ca play the role of a p-type impurity in the BAlN crystal. These atoms give extra holes in the valence bands.

These impurities can be doped into the growing BAlN films by supplying the impurity in the form of monoelements, oxides, halides, hydrides or metalorganic compounds. The oxides as dopants are, e.g., $SiO_x$, $CO$, $CO_2$, $SO_2$, $SeO_2$, $BeO$, $MgO$, $ZnO$, $CaO$ or so. The halides are, e.g., $SiCl_2$, $CCl_4$, $SeCl_2$, $BeBr_2$, $MgCl_2$, $ZnCl_2$, $CaCl_2$ etc. The hydrides are $SiH_4$, $H_2S$, $H_2Se$ and the like.

It is preferable to dope the impurity into growing films by supplying the impurity together with other materials. The ion implantation is less suitable because of the difficulty of recovery of the lattice regularity after the ion injection.

[7. APPLICATIONS FOR HARD FILM COATED MEMBERS, e.g., TOOLS]

The hard coating of the invention can be applied to tools, e.g., cutting tools or abrasive resistant tools. The application to the tools requires that the coating film should be a polycrystal consisting of fine particles and that the film must be able to be formed on cemented carbides or ceramics as a substrate. Otherwise the film would be inferior in the breakdown strength.

Then polycrystalline BAlN is more suitable for tools than single crystal one. Also in the case of forming polycrystalline BAlN films, an undercoating of $Al_2O_3$, AlN, $Si_3N_4$ or SiC which has hexagonal symmetry as an undercoating is advantageous. The undercoating of the materials can enhance the hardness of the BAlN top coating and can maintain a wurtzite type polycrystalline structure till a considerable high ratio x of boron. Therefore, it is preferable to undercoating cemented carbides or ceramics with an undercoating of $Al_2O_3$, AlN, $Si_3N_4$ and the like of hexagonal symmetry and form a top $B_xAl_{1-x}N_y$ film with a considerably high boron ratio x. The BAlN coating heightens the performance of the general-use tools drastically.

Unlike the aforementioned case for making a single crystal BAlN, this case demands polycrystalline intermediate layers. The polycrystalline intermediate layers make a polycrystalline BAlN top layer consisting of fine particles. The fine particles endow the coating with high adhesion to the tool body.

Multilayered BAlN films with a higher boron ratio can be produced by piling a plurality of thin $Al_2O_3$, AlN or $Si_3N_4$ layers and a plurality of BAlN layers one after the other. In the multilayered film, an individual BAlN layer is sandwiched by the neighboring reinforcing films of $Al_2O_3$ etc. A reinforcing film is also sandwiched by the neighboring BAlN films. In the multilayered films, 1 nm to 100 nm is the preferable range of the thickness of a BAlN film. The BAlN thickness less than 1 nm is useless for raising the hardness. The BAlN thickness more than 100 nm hinders the neighboring $Al_2O_3$ layers etc., from reinforcing the BAlN with a high x. The reinforcing layers should be thicker than 1 nm but thinner than twice of the individual BAlN layer.

Other multilayered films can be produced by the reciprocal piles of BAlN and TiN, TiC or the like which has other crystallographical structure other than hexagonal symmetry. The sandwiching of BAlN layers with TiN or TiC enhances the hardness by facilitating the crystallization of BAlN layers at a low boron ratio x. The reinforcement by TiN or TiC, however, has a tendency of inviting a crystal-amorphism transition at a high boron ratio x.

It is desirable to synthesize the BAlN films in an atmosphere having many active nitrogen atoms, e.g., atomic nitrogen or ionic nitrogen. Thus, the preferable methods are the sputtering method, the ion plating method, the plasma CVD method, the ion beam evaporation method and the laser ablation method.

The substrate temperature should be higher than 400° C. for acquiring polycrystalline BAlN. More suitable temperature of the substrate is higher than 600° C. Preferably the substrate should be heated above 700° C. Amorphous BAlN accompanies a temperature less than 400° C.

The deposition speed should be 5 μm/H for making hard and well-ordered BAlN films. The slower the speed rises, the higher the property of the films is. When x>0.1 in particular, the speed should be lower than 1.5 μm/H.

In the description, two kinds of indexes are used for expressing the planes of hexagonal symmetry of BAlN crystals. One is three index type expression (a b c). The other is four index type expression (k h m c). The c-axis index is common for the two. In the four index type, a sum rule k+h+m=0 holds among three parameters. The relations are given by k=a, h=b, m=−a−b or a=k and b=h. This (0001)= (001), (1010)=(100), (1120)=(110) or (2130)=(210).

Figure 9:
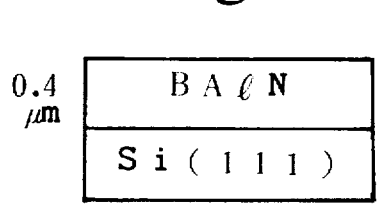
FIG. 9 is a simplified section of BAlN/Si(111) proposed by embodiment 1.

[EMBODIMENT 1:(silicon substrate)(FIG. 9)]

A single crystal silicon (111) wafer of a 10 mm square is selected as a substrate. Silicon has the cubic lattice structure and a (111) plane has three-fold rotation symmetry. Boron-aluminum nitride films are synthesized by the sputtering method in the following steps.

The square substrate is dipped in 5% fluoric acid diluted with pure water and is cleansed by acetone. The target for sputtering is produced by melting metal aluminum in a nitrogen atmosphere of a reduced pressure (less than 1 atm), dispersing 15 wt % of aluminum nitrogen (AlN) and 15 wt % of cubic boron nitride (c-BN) into the aluminum melt, and solidifying the melt into a solid mixture by cooling. The target then includes aluminum (Al), boron (B) and nitrogen (N).

FIG. 4 shows a magnetron sputtering apparatus. A reaction chamber (10) contains a target (11), a target supporter, a susceptor (14). The target (11) is made from the material which will make an object film. A power source (13) biases the target at a negative voltage. A substrate (15) is placed on the susceptor (14) and heated by a heater (16). A material gas is introduced into the reaction chamber (10) through a gas inlet (17). The gas waste is exhausted from the chamber (10) via a gas outlet (18). Magnets (12) in the supporter facilitates ions to sputter the target by confining the ions by magnetic forces.

The target and the substrate are installed in a radio-frequency magnetron sputtering apparatus. The apparatus is once evacuated. Then, the apparatus is supplied with a mixture gas containing 50 vol % of argon gas (Ar) and 50 vol % of nitrogen gas ($N_2$). The total pressure in the apparatus is regulated to 0.05 Torr (6.6 Pa) by controlling the gas flux. The Si monocrystal substrate is heated and kept at 1150° C. The target is sputtered by the argon-nitrogen plasma excited by a 350 W power of the microwave of 13.56 MHz. One hour sputtering brings about a thin film of a 0.4 μm thickness on the Si(111) substrate.

The film is analysed by the secondary ion mass spectrometry (SIMS). The film turns out to have a composition of $B_{0.015}Al_{0.985}N_{0.97}$. Thus, the parameters take the values of x=0.015 and y=0.97. These values are included in the prescribed range of $0.001 \leq x \leq 0.70$ and $0.85 \leq y \leq 1.05$.

The film is observed by the X-ray diffraction method. The diffraction pattern shows only the diffraction lines from c-planes. There is no diffraction from other planes. This result foretells that the film would be a wurtzite-type single crystal or a wurtzite-type highly-oriented polycrystal. The rocking curve shows 1.5 degrees of the width at the half value of the peaks. Such a small value of the peak width suggests a highly regular orientation of crystal grains. Further, the film is examined by the reflective high energy electron diffraction (RHEED). The RHEED proves the film to be a wurtzite-type single crystal.

[COMPARISON EXAMPLE 1:(silicon substrate)]

A similar experiment is carried out with a different target in order to examine the influence of the composition on the crystallographical property. A boron-containing aluminum nitride film is made on a monocrystal Si(111) substrate by the sputtering method in a similar manner to embodiment 1. The substrate is a 10 mm×10 mm Si(111) single crystal. The Si substrate is dipped into a fluoric acid diluted to 5% by pure water and is washed in acetone. The target is made by mixing 20 wt % of aluminum nitrogen (AlN) powder and 80 wt % of cubic boron nitride (c-BN) powder and solidifying the mixture powder by pressing. Thus, the target includes a lower ratio of aluminum than the target of embodiment 1.

The Si substrate and the target are fixed in the same radio-frequency magnetron sputtering apparatus. The apparatus is once made vacuous. A mixture gas containing 50 vol % of Ar and 50 vol % of $N_2$ is introduced into the apparatus. The pressure in the apparatus is adjusted at 0.05 Torr (6.6 Pa) by controlling the flux of the Ar/$N_2$ gas. The substrate is heated and maintained at 1150° C. The target is sputtered by the plasma made by 350 W of the microwave of 13.56 MHz. One hour sputtering produces a film of a 0.3 μm thickness. The secondary ion mass spectrometry (SIMS) shows that the composition is represented by $B_{0.83}Al_{0.17}N_{0.80}$. The film is tested also by the X-ray diffraction method. No diffraction line except the diffraction from the Si substrate appears in the diffraction pattern. The result indicates that the film has no crystal structure and is an amorphous film. Since the ratio of boron is excessive and the ratio of nitrogen is too small, the film cannot form a long-range lattice structure. The amorphous film is specified by the parameters x=0.83 and y=0.80. These values fall outside of the range of $0.001 \leq x \leq 0.70$ and $0.85 \leq y \leq 1.05$.

Figure 10:
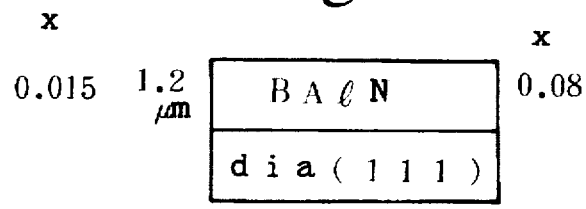
FIG. 10 is a simplified section of BAlN/diamond(111) proposed by embodiment 2.

[EMBODIMENT 2:(diamond substrate)(FIG. 10)]

A BAlN film is yielded by a microwave plasma CVD method on a diamond substrate with a hydrogen-terminated surface. The substrate is a polished single crystal (111) diamond of a 3.5 mm square which has been produced by the high pressure synthesis method. Since diamond is a cubic-symmetry crystal, a (111) axis has three fold symmetry. The diamond substrate is cleansed by an organic solvent and successively by 10% hydrochloric acid. Then the diamond substrate is dealt with the surface hydrogen-termination which terminates dangling bonds at the surface of diamond with hydrogen atoms. The surface hydrogen termination treatment is done for ten minutes in a microwave plasma apparatus by the steps of introducing hydrogen gas alone into the apparatus, exciting the hydrogen gas into plasma by supplying 400 W of microwave and keeping the pressure at 100 Torr ($1.3 \times 10^4$ Pa).

The treated substrate is removed from the apparatus and is set on a susceptor of another microwave plasma CVD apparatus which has been designed for synthesizing diamond. The CVD apparatus is replenished with a mixture of 1 vol % of diborane ($B_2H_6$), 4 vol % of aluminum chloride ($AlCl_3$), 45 vol % of hydrogen gas and 50 vol % of argon gas (Ar). The intake of the mixture gas is controlled in order to maintain the total pressure at 5 Torr (660 Pa). The mixture gas is excited into plasma by introducing 800 W of microwave of 2.45 GHz. The diamond substrate is heated and kept at 1150° C. The plasma induces the vapor phase reaction of making BAlN. One hour CVD growth makes a BAlN film of a 1.2 μm thickness on the diamond substrate.

The secondary ion mass spectrometry (SIMS) reveals that the film takes the composition of $B_{0.08}Al_{0.92}N_{1.00}$. Thus x=0.08 and y=1.00 in the film. The values of the parameters are included in the prescribed range of $0.001 \leq x \leq 0.70$ and $0.85 \leq y \leq 1.05$.

The X-ray diffraction method shows a diffraction pattern containing only the diffraction lines from c-planes. This result suggests that the film would be either a wurtzite-type single crystal or a wurtzite-type c-oriented polycrystal. The width of the half height of the peaks in the rocking curve is 3.2 degrees in the X-ray diffraction. The width gives a hint of c-orientation of the film. The reflective high energy electron diffraction (RHEED) verifies that the film is a wurtzite-type c-oriented polycrystal.

Figure 11:
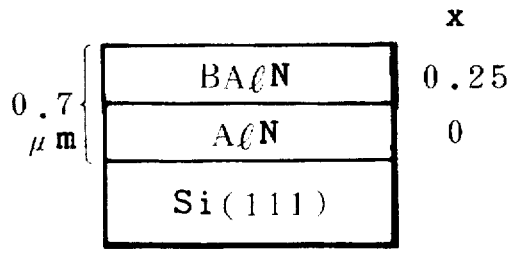
FIG. 11 is a simplified section of BAlN/AlN/Si(111) proposed by embodiment 3.

[EMBODIMENT 3:(silicon substrate)(FIG. 11)]

A boron-aluminum nitride film BAlN is grown an AlN intermediate layer on a silicon (111) single crystal substrate by the sputtering method. A silicon (111) single crystal plate of a 10 mm square is immersed in 5% fluoric acid diluted with pure water and is washed by acetone. Two targets are used. A target (target 1) for making an AlN film is made from only aluminum. The other target (target 2) for producing a BAlN film is made by melting metal aluminum in nitrogen atmosphere of a pressure less than 1 atm (0.1 MPa) and dispersing c-BN powder to 30 wt % in the molten aluminum and solidifying the melt. The targets and the silicon substrate are installed in an ordinary radio-frequency magnetron sputtering apparatus. An AlN intermediate layer and a BAlN top layer are produced by the magnetron sputtering method under the following conditions.

| | |
|---|---|
| material gas | Ar + $N_2$ gas (Ar:$N_2$ = 1:1) |
| pressure | 0.005 Torr |
| substrate temperature | 1150° C. |
| radio frequency | 13.56 MHz |
| electric power | 400 W |
| time of sputtering | AlN film formation 10 min(target 1) |
| | BAlN film formation 1 hour(target 2) |
| total film thickness | 0.7 μm |

The films are analyzed by the secondary ion mass spectrometry. The intermediate layer has a composition of $AlN_{0.98}$ (x=0, Y=0.98). The top layer has another composition of $B_{0.25}Al_{0.75}N_{0.97}$ (x=0.25, y=0.97). The film is observed by the X-ray diffraction method. Only the diffraction lines from c-planes are observed. The fact suggests that the film should be a single crystal or highly oriented polycrystal of wurtzite type. The rocking curve is measured for a peak. The full width at half maximum (FWHM) of the rocking curve is 1.5 degrees. The film turns out to be a highly-oriented crystal. Then, the sample is tested by the reflection high energy electron diffraction (RHEED). The RHEED observation shows that the film is a single crystal having the wurtzite type crystal structure.

In order to examine the intermediate film, only an intermediate layer is made on the similar Si substrate by the same method on the same condition. The intermediate film has about a 0.1 µm thickness. The RHEED measurement reveals the diffraction patterns which indicate the wurtzite crystal structure. The patterns change according to the direction of the incident electron beams. The change of patterns means that the film is a single crystal.

Figure 12:
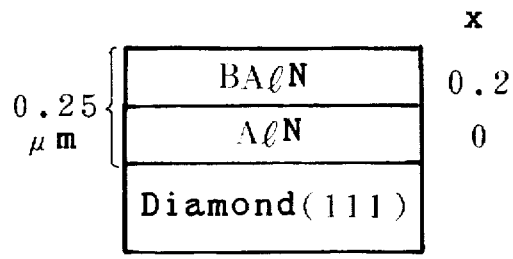
FIG. 12 is a simplified section of BAlN/AlN/diamond (111) proposed by embodiment 4.

[EMBODIMENT 4:(diamond substrate)(FIG. 12)]

A boron-aluminum nitride film BAlN is grown via an AlN intermediate film on a diamond (111) single crystal substrate by the molecular beam epitaxy method (MBE). The diamond single crystal is made by the ultrahigh pressure method. The diamond substrate is a plate of a 3.5 mm square. The diamond substrate is washed with an organic solvent and is washed with 10% hydrochloric acid. The diamond crystal is treated with the surface hydrogen termination process which extinguishes dangling bonds of carbon atoms by coupling hydrogen atoms to the extra bonds. The surface hydrogen termination process is done by setting the diamond plate in a microwave plasma CVD apparatus, supplying only hydrogen gas in the chamber, introducing microwave power of 400 W under 100 Torr (13000 Pa) for ten minutes.

An AlN intermediate layer and a BAlN top layer are produced on the diamond substrate by the MBE apparatus under the following conditions.

| Apparatus | molecular beam epitaxy apparatus |
|---|---|
| Aluminum source | metal aluminum in a K-cell |
| Boron source | metal boron in another K-cell |
| K-cell heating | electron beam heating |
| Substrate temperature | 900° C. |
| Nitrogen source | $N_2$ gas excited by ECR ion source |
| ECR ion source power | 50 W |
| ion current | 25 µA |
| AlN formation (intermediate layer) | |
| Al evaporation rate | 0.025 nm/s |
| deposition time | 38 min |
| BAlN formation (top layer) | |
| Al evaporation rate | 0.02 nm/s |
| B evaporation rate | 0.005 nm/s |
| deposition time | 150 min |
| Total thickness | 0.25 µm |

The films are analyzed by the secondary ion mass spectrometry. The intermediate layer has a composition of $AlN_{0.99}$ (x=0, Y=0.99). The top layer has another composition of $B_{0.2}Al_{0.8}N_{0.99}$ (x=0.2, y=0.99). The film is observed by the X-ray diffraction method. The rocking curve is measured for the peak from c-planes. The full width at half maximum (FWHM) of the rocking curve is 1.3 degrees. The film turns out to be a highly-oriented crystal. Then the sample is tested by the reflection high energy electron diffraction (RHEED). The RHEED observation confirms that the film is a single crystal having the wurtzite type crystal structure.

In order to examine the intermediate film, only an intermediate layer is made on the similar diamond substrate by the same method on the same condition. The intermediate film has about a 0.05 µm thickness. The RHEED measurement reveals the diffraction patterns which indicate the wurtzite crystal structure. The patterns change according to the direction of the incident electron beams. The change of patterns means that the film is a single crystal.

Figure 13:
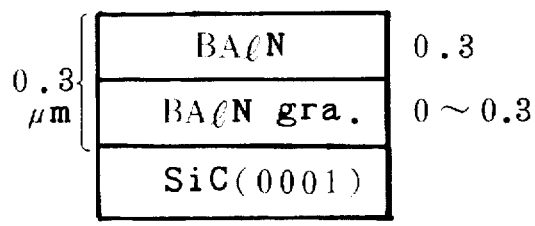
FIG. 13 is a simplified section of BAlN/grad-BAlN/SiC (0001) proposed by embodiment 5.

[EMBODIMENT 5:(SiC substrate)(FIG. 13)]

A boron-aluminum nitride film BAlN is grown via a gradient component BAlN intermediate layer on a hexagonal silicon carbide SiC (0001) single crystal substrate by the molecular beam epitaxy method (MBE). The silicon carbide substrate is prepared by washing with an organic solvent, immersing in 10% fluoric acid in order to eliminate the natural oxide film and washing with pure water.

A gradient component BAlN intermediate layer and a BAlN top layer are produced on the SiC substrate by the MBE apparatus under the following conditions.

| Apparatus | molecular beam epitaxy apparatus |
|---|---|
| Aluminum source | metal aluminum in a K-cell |
| Boron source | metal boron in another K-cell |
| K-cell heating | electron beam heating |
| Substrate temperature | 900° C. |
| Nitrogen source | $N_2$ gas excited by ECR ion source |
| ECR ion source power | 50 W |
| ion current | 25 µA |
| Gradient component BAlN formation (intermediate layer with sublayers) | |
| Al evaporation rate | 0.025 nm/s–0.015 nm/s |
| B evaporation rate (evaporation rates change continually and linearly) | 0 nm/s–0.01 nm/s |
| deposition time | 75 min |
| BAlN formation (top layer) | |
| Al evaporation rate | 0.015 nm/s |
| B evaporation rate | 0.01 nm/s |
| deposition time | 150 min |
| Total thickness | 0.3 µm |

The films are analyzed by the secondary ion mass spectrometry. The intermediate layers have continuously varying compositions from $AlN_{0.99}$ (x=0, Y=0.99) to $B_{0.3}Al_{0.7}N_{0.99}$ (x=0.3, y=0.99). The top layer has a constant composition of $B_{0.3}Al_{0.7}N_{0.99}$ (x=0.3, y=0.99). The film is observed by the X-ray diffraction method. Only the diffraction lines from c-planes appear. This fact suggests that the film should be a wurtzite type highly oriented polycrystal or single crystal. The rocking curve is measured for the peak from c-planes. The full width at half maximum (FWHM) of the rocking curve is 1.3 degrees. The film turns out to be a highly-oriented crystal. Then the sample is tested by the reflection high energy electron diffraction (RHEED). The RHEED observation confirms that the film is a single crystal having the wurtzite type crystal structure.

In order to examine the intermediate film with sublayers, only an intermediate layer is made on the similar SiC substrate by the same method on the same condition. The intermediate film has about a 0.1 µm thickness. The RHEED measurement reveals the diffraction patterns which indicate the wurtzite crystal structure. The patterns change according to the direction of the incident electron beams. The change of patterns means that the film is a single crystal.

Figure 14:
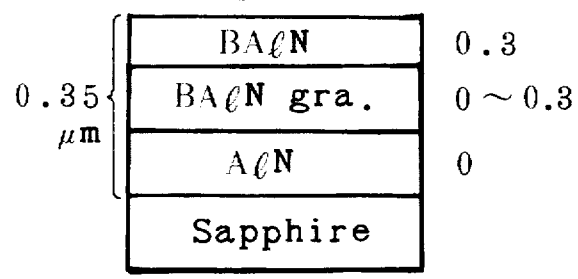
FIG. 14 is a simplified section of BAlN/grad-BAlN/AlN/sapphire proposed by embodiment 6.

[EMBODIMENT 6:(sapphire substrate)(FIG. 14)]

A boron-aluminum nitride film BAlN is grown via intermediate AlN and gradient-BAlN layers on a hexagonal sapphire ($\alpha$-$Al_2O_3$) (0001) single crystal substrate by the molecular beam epitaxy method (MBE). The sapphire substrate of a c-plane is prepared by washing with an organic solvent and immersing in 10% hydrochloric acid (HCl).

An AlN intermediate layer (1st intermediate layer), a BAlN intermediate layer with sublayer of gradient B/Al compositions (second intermediate layer) and a BAlN top layer are produced on the sapphire ($\alpha$-$Al_2O_3$) substrate by the MBE apparatus under the following conditions.

| Apparatus | molecular beam epitaxy apparatus |
|---|---|
| Aluminum source | metal aluminum in a K-cell |
| Boron source | metal boron in another K-cell |
| K-cell heating | electron beam heating |
| Substrate temperature | 900° C. |
| Nitrogen source | $N_2$ gas excited by ECR ion source |
| ECR ion source power | 50 W |
| ion current | 25 μA |
| AlN (first intermediate layer) formation | |
| Al evaporation rate | 0.025 nm/s |
| deposition time | 38 min |
| Gradient component BAlN (2-nd intermediate layer with sublayers) formation | |
| Al evaporation rate | 0.025 nm/s–0.015 nm/s |
| B evaporation rate | 0 nm/s–0.01 nm/s |
| (evaporation rates change continually and linearly) | |
| deposition time | 75 min |
| BAlN formation (top layer) | |
| Al evaporation rate | 0.015 nm/s |
| B evaporation rate | 0.01 nm/s |
| deposition time | 150 min |
| Total thickness | 0.35 μm |

The films are analyzed by the secondary ion mass spectrometry. The first intermediate layer has a constant composition of $AlN_{0.99}$ (x=0, y=0.99). The second intermediate layer with sublayers has continuously varying compositions from $AlN_{0.99}$ (x=0, Y=0.99) to $B_{0.3}Al_{0.7}N_{0.99}$ (x=0.3, y=0.99). The top layer has a constant composition of $B_{0.3}Al_{0.7}N_{0.99}$ (x=0.3, y=0.99). The film is observed by the X-ray diffraction method. Only the diffraction lines from c-planes appear. This fact suggests that the film should be a wurtzite type highly oriented polycrystal or single crystal. The rocking curve is measured for the peak of (0002) diffraction. The full width at half maximum (FWHM) of the rocking curve is 1.3 degrees. The film turns out to be a highly-oriented crystal. Then the sample is tested by the reflection high energy electron diffraction (RHEED). The RHEED observation confirms that the film is a single crystal having the wurtzite type crystal structure.

In order to examine the intermediate films, only an intermediate layer is made on a similar sapphire substrate by the same method on the same condition as the first intermediary layer.

The first intermediate film has about a 0.05 μm thickness. Then intermediate layers are made on a similar sapphire by the same method as the formation of the first and the second intermediate layer. The thickness of the intermediate layers is 0.15 μm. The RHEED measurement reveals the diffraction patterns which indicate the wurtzite crystal structure. The patterns change according to the direction of the incident electron beams. The change of patterns means that the film is a single crystal.

Figure 15:
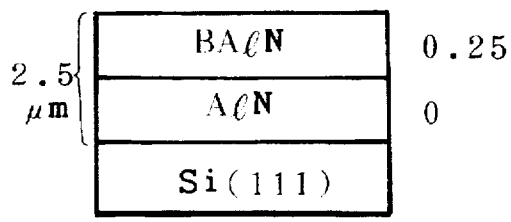
FIG. 15 is a simplified section of BAlN/AlN/Si(111) proposed by embodiment 7.

[EMBODIMENT 7:(silicon substrate)(FIG. 15)]

A boron-aluminum nitride film BAlN is grown via an AlN intermediate layer on a silicon (111) single crystal substrate by the microwave plasma CVD method. The silicon substrate is prepared by immersing in 5% fluoric acid diluted with pure water and washing with acetone.

An AlN intermediate layer and a BAlN top layer are produced on the silicon substrate in the microwave plasma CVD apparatus under the following conditions.

| Apparatus | microwave plasma CVD apparatus |
|---|---|
| Total pressure | 5 Torr(660Pa) |
| Microwave frequency | 2.45 GHz |
| Microwave power | 800 W |
| Substrate temperature | 1150° C. |
| 1st step Material gas | |
| hydrogen gas | 45 vol % |
| ammonia gas($NH_3$) | 50 vol % |
| aluminum trichloride($AlCl_3$) | 5 vol % |
| deposition time | 10 min |
| 2nd step Material gas | |
| hydrogen gas | 45 vol % |
| ammonia gas | 50 vol % |
| diborane gas ($B_2H_6$) | 2.5 vol % |
| aluminum trichloride ($AlCl_3$) | 2.5 vol % |
| deposition time | 120 min |
| Total thickness | 2.5 μm |

The films are analyzed by the secondary ion mass spectrometry. The first intermediate layer has a constant composition of $AlN_{0.99}$ (x=0, y=0.99). The top layer has a constant composition of $B_{0.25}Al_{0.75}N_{0.99}$ (x=0.25, y=0.99). The film is observed by the X-ray diffraction method. Only the diffraction lines from c-planes appear. This fact suggests that the film should be a wurtzite type highly oriented polycrystal or single crystal. The rocking curve is measured for the peak of (0002) diffraction. The full width at half maximum (FWHM) of the rocking curve is 1.5 degrees. The film turns out to be a highly-oriented crystal. Then the sample is tested by the reflection high energy electron diffraction (RHEED). The RHEED observation confirms that the film is a single crystal having the wurtzite type crystal structure.

In order to examine the intermediate film, only an intermediate layer is made on a similar silicon substrate by the same method on the same condition as the intermediate layer. The intermediate film has about a 0.1 μm thickness. The RHEED measurement reveals the diffraction patterns which indicate the wurtzite crystal structure. The patterns change according to the direction of the incident electron beams. The change of patterns means that the film is a single crystal.

Figure 16:
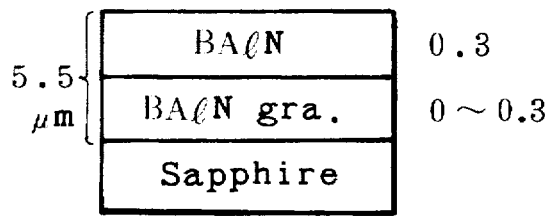
FIG. 16 is a simplified section of BAlN/grad-BAlN/sapphire proposed by embodiment 8.

[EMBODIMENT 8: (sapphire substrate)(FIG. 16)]

A boron-aluminum nitride film BAlN is grown via an intermediate, gradient-BAlN layer on a sapphire (0001) single crystal substrate by the metalorganic CVD method. The sapphire ($\alpha$-$Al_2O_3$) substrate is prepared by washing with an organic solvent and immersing in 10% hydrochloric acid.

A gradient composition BAlN intermediate layer and a BAlN top layer are produced on the sapphire substrate in the MOCVD apparatus under the following conditions.

| Apparatus | MOCVD apparatus |
|---|---|
| Total pressure | 5 Torr(660Pa) |
| Substrate temperature | 1200° C. |

-continued

1st step (intermediate layer with sublayers)
Material gas

| | |
|---|---|
| hydrogen gas (H$_2$) | 100 sccm |
| ammonia gas (NH$_3$) | 3 slm |
| | (3000 sccm) |
| H$_2$ + trimethylalminum (Al(CH$_3$)$_3$) | 10 sccm to |
| | 5 sccm |
| H$_2$ + 1% diborane gas (B$_2$H$_6$) | 0 sccm to 5 sccm |
| (Al(CH$_3$)$_3$ is bubbled by H$_2$, Al(CH$_3$)$_3$ flux and B$_2$H$_6$ flux are continuously changed in the deposition time) | |
| deposition time | 10 min |

2nd step (top layer)
Material gas

| | |
|---|---|
| hydrogen gas (H$_2$) | 100 sccm |
| ammonia gas (NH$_3$) | 3 slm |
| H$_2$ + trimethylalminum (Al(CH$_3$)$_3$) | 5 sccm |
| H$_2$ + 1% diborane gas (B$_2$H$_6$) | 5 sccm |
| (Al(CH$_3$)$_3$ is bubbled by H$_2$) | |
| deposition time | 120 min |
| Total thickness | 5.5 μm |

The films are analyzed by the secondary ion mass spectrometry. The intermediate layer has compositions continually changing from AlN$_{0.99}$(x=0, y=0.99) to B$_{0.30}$Al$_{0.70}$N$_{0.99}$ (x=0.3, Y=0.99). The top layer has a constant composition of B$_{0.30}$Al$_{0.70}$N$_{0.99}$ (x=0.3, Y=0.99). The film is observed by the X-ray diffraction method. Only the diffraction lines from c-planes appear. This fact suggests that the film should be a wurtzite type highly oriented polycrystal or single crystal. The rocking curve is measured for the peak of (0002) diffraction. The full width at half maximum (FWHM) of the rocking curve is 1.5 degrees. The film turns out to be a highly-oriented crystal. Then the sample is tested by the reflection high energy electron diffraction (RHEED). The RHEED observation confirms that the film is a single crystal having the wurtzite type crystal structure.

In order to examine the intermediate film with sublayers, only an intermediate layer is made on a similar sapphire substrate by the same method on the same condition as the intermediate layer. The intermediate film has about a 0.5 μm thickness. The RHEED measurement reveals the diffraction patterns which indicate the wurtzite crystal structure. The patterns change according to the direction of the incident electron beams. The change of patterns means that the film is a single crystal.

Figure 17:
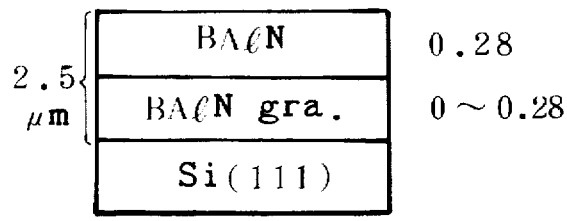
FIG. 17 is a simplified section of BAlN/grad-BAlN/Si (111) proposed by embodiment 9.
Figure 18:
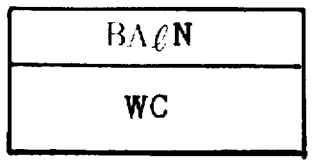
FIG. 18 is a simplified section of BAlN/WC-cemented carbide which is one of the examples proposed by embodiment 10.
Figure 19:
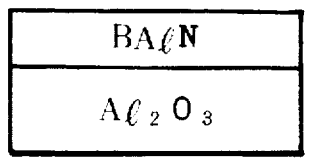
FIG. 19 is a simplified section of BAlN/$Al_2O_3$ which is one of the examples proposed by embodiment 10.
Figure 20:
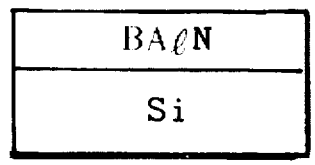
FIG. 20 is a simplified section of BAlN/Si which is one of the examples proposed by embodiment 10.
Figure 21:
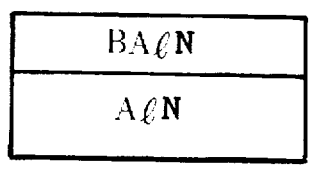
FIG. 21 is a simplified section of BAlN/AlN which is one of the examples proposed by embodiment 10.
Figure 22:
FIG. 22 is a simplified section of BAlN/Si$_3$N$_4$ which is one of the examples proposed by embodiment 10.
Figure 23:
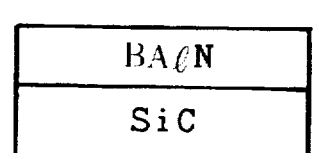
FIG. 23 is a simplified section of BAlN/SiC which is one of the examples proposed by embodiment 10.

[EMBODIMENT 9:(silicon substrate)(FIG. 17)]

A boron-aluminum nitride film BAlN is grown via an intermediate, gradient-BAlN layer on a silicon (111) single crystal substrate by the microwave plasma CVD method. The silicon substrate is prepared by immersing in 5% fluoric acid diluted with pure water and washing with acetone.

A gradient-component BAlN intermediate layer and a BAlN top layer are produced on the silicon (111) substrate in the microwave plasma CVD apparatus under the following conditions.

| | |
|---|---|
| Apparatus | microwave plasma CVD apparatus |
| Total pressure | 5 Torr(660Pa) |
| Nicrowave frequency | 2.45 GHz |
| Microwave power | 800 W |
| Substrate temperature | 1150° C. |

-continued

1st step (gradient composition BAlN film)
Material gas

| | |
|---|---|
| hydrogen gas(H$_2$) | 100 sccm |
| ammonia gas(NH$_3$) | 3 slm |
| H$_2$ + aluminum trichloride(AlCl$_3$) | 10 sccm to |
| | 5 sccm |
| H$_2$ + 0.5% boron trichloride (BCl$_3$) | 0 sccm to 5 sccm |
| (AlCl$_3$ flux and BCl$_3$ flux are changed in the deposition time) | |
| deposition time | 10 min |

2nd step (top BAlN film)
Material gas

| | |
|---|---|
| hydrogen gas (H$_2$) | 100 sccm |
| ammonia gas (NH$_3$) | 3 slm |
| H$_2$ + trimethylaluminum (TMA) | 5 sccm |
| H$_2$ + 0.5% boron trichloride (BCl$_3$) | 5 sccm |
| deposition time | 120 min |
| Total thickness | 2.5 μm |

The films are analyzed by the secondary ion mass spectrometry. The intermediate layer with sublayers has compositions changing from AlN$_{0.99}$ (x=0, y=0.99) to B$_{0.28}$Al$_{0.72}$N$_{0.99}$ (x=0.28, y=0.99). The top layer has a constant composition of B$_{0.28}$Al$_{0.72}$N$_{0.99}$ (x=0.28, y=0.99). The film is observed by the X-ray diffraction method. Only the diffraction lines from c-planes appear. This fact suggests that the film should be a wurtzite type highly oriented polycrystal or single crystal. The rocking curve is measured for the peak of (0002) diffraction. The full width at half maximum (FWHM) of the rocking curve is 1.5 degrees. The film turns out to be a highly-oriented crystal. Then the sample is tested by the reflection high energy electron diffraction (RHEED). The RHEED observation confirms that the film is a single crystal having the wurtzite type crystal structure.

In order to examine the intermediate film with sublayers, only an intermediate layer is made on a similar silicon substrate by the same method on the same condition as the intermediate layer. The intermediate film has about 0.1 μm thickness. The RHEED measurement reveals the diffraction patterns which indicate the wurtzite crystal structure. The patterns change according to the direction of the incident electron beams. The change of patterns means that the film is a single crystal.

[EMBODIMENT 10:(substrate-dependence of x-parameters) (FIGS. 18–25)]

Boron-aluminum films are deposited on various substrates heated at a proper temperature by the magnetron sputtering method under the following conditions.

Figure 24:
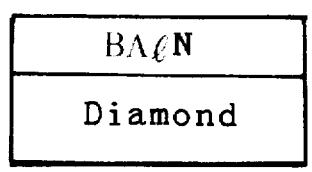
FIG. 24 is a simplified section of BAlN/diamond which is one of the examples proposed by embodiment 10.

Apparatus magnetron sputtering apparatus
Target metal boron+metal aluminum
(ratio of B area : Al area on target is changed)
Thickness of BAlN film 0.8 μm to 1.2 μm
x values 0.005, 0.01, 0.04, 0.10, 0.20, 0.40, 0.60
substrate 1. WC-based cemented carbide (FIG. 18)
2. aluminum oxide (alumina) polycrystal(α-Al$_2$O$_3$)(FIG. 19)
3. silicon polycrystal (FIG. 20)
4. aluminum nitride polycrystal (AlN) (FIG. 21)
5. silicon nitride polycrystal (Si$_3$N$_4$) (FIG. 22)
6. silicon carbide polycrystal (SiC) (FIG. 23)
7. diamond polycrystal (C) (FIG. 24)

Figure 25:
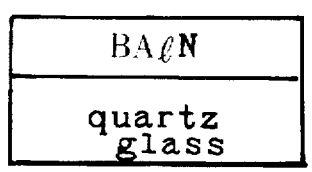
FIG. 25 is a simplified section of BAlN/(quartz glass) which is one of the examples proposed by embodiment 10.

8. quartz glass ($SiO_2$) amorphous (FIG. 25)

TABLE 1

| SUBSTRATE AND X-VALUE DEPENDENCE OF $B_xAl_{1-x}N_y$ FILMS | | | | | | | |
|---|---|---|---|---|---|---|---|
| substrate | BORON RATIOS (x) IN $B_xAl_{1-x}N_y$ FILMS | | | | | | |
| materials | 0.005 | 0.01 | 0.04 | 0.10 | 0.20 | 0.40 | 0.60 |
| WC-based cemented carbide | ○ | ○ | ○ | x | x | — | — |
| $Al_2O_3$ | ○ | ○ | ○ | ○ | ○ | Δ | x |
| Si | ○ | ○ | Δ | x | — | — | — |
| AlN | — | — | — | ○ | ○ | ○ | x |
| $Si_3N_4$ | ○ | ○ | ○ | ○ | ○ | Δ | x |
| SiC | ○ | ○ | ○ | ○ | ○ | ○ | x |
| diamond | ○ | ○ | ○ | x | x | — | — |
| quartz glass | ○ | x | — | — | — | — | — |

○: wurtzite type polycrystal (good quality)
Δ: wurtzite type polycrystal (poor quality)
x: amorphous
—: not experimented Table 1 denotes the state of the films which are specified by the sorts of substrates and the x-values (boron ratios). In the table 1, "○" means that the film becomes a wurtzite type hexagonal polycrystal of good crystallographical property, "Δ" denotes that the film becomes a wurtzite type hexagonal polycrystal of poor crystallographical property, "x" means that the film becomes amorphous and "—" indicates that the inventors did not experiment. The films are estimated by the X-ray diffraction method which rotates specimens by the θ-2θ scanning mode. The "good crystallographical property" means that the FWHM at the (100) plane diffraction ranges from 0.6 degree to 1.5 degrees. The "poor" means more than 1.5 degrees of the FWHM of the (100) plane diffraction.

The WC-based cemented carbide substrate can make a good wurtzite type crystal $B_xAl_{1-x}N_y$ at x=0.005, x=0.01 and x=0.04. But x=0.10 and x=0.20 make BAlN amorphous on the WC-cemented carbide.

The aluminum oxide (alumina) substrate ($\alpha$-$Al_2O_3$) enables to make good wurtzite type $B_xAl_{1-x}N_y$ crystals up to x=0.20. The $B_xAl_{1-x}N_y$ film is still a wurtzite type crystal at x=0.40, although the crystallography degrades. X=0.6 makes the $B_xAl_{1-x}N_y$ film amorphous. X=0.55 is the boundary between an amorphous state and a crystal state for the $B_xAl_{1-x}N_y$ films on aluminum oxide ($\alpha$-alumina) substrates.

The silicon substrate produces a wurtzite type $B_xAl_{1-x}N_y$ crystal up to x=0.01. The $B_xAl_{1-x}N_y$ crystal degenerates at x=0.04. At x=0.10 the film is amorphous. Polycrystal silicon is not a suitable substrate for making crystalline $B_xAl_{1-x}N_y$ films.

The AlN substrate is capable of producing good wurtzite type $B_xAl_{1-x}N_y$ crystals at x=0.10, x=0.20 and x=0.40. At x=0.6, the film becomes amorphous. The critical value is x=0.55 in the AlN substrate. AlN is one of the most promising materials for the formation of $B_xAl_{1-x}N_y$ films.

The $Si_3N_4$ substrate is capable of producing good wurtzite type $B_xAl_{1-x}N_y$ crystals from x=0.005 to x=0.20. X=0.4 degrades the property of the crystal. At x=0.6, the film becomes amorphous. The critical value is x=0.55 in the $Si_3N_4$ substrate. $Si_3N_4$ is also a promising material for the formation of $B_xAl_{1-x}N_y$ films.

The SiC substrate can produce good wurtzite type $B_xAl_{1-x}$ $N_y$ crystals at x=0.005, x=0.01, x=0.04, x=0.10, x=0.20 and x=0.40. At x=0.6, the film becomes amorphous. The critical value is x=0.55 in the SiC substrate. SiC is also one of the most promising materials for the formation of $B_xAl_{1-x}N_y$ films.

The quartz substrate fails in making crystalline $B_xAl_{1-x}N_y$ films at x=0.01.

The results shows a strong influence of the x-values on the crystalline property of $B_xAl_{1-x}N_y$. The other value y also affects the property of $B_xAl_{1-x}N_y$. Optimum range of y is from y=0.94 to y=1.01. Suitable scope of y ranges from y=0.85 to y=1.05. In any cases, $B_xAl_{1-x}N_y$ becomes amorphous both in y<0.85 or in y>1.05.

TABLE 2

| SUBSTRATE AND X-VALVE DEPENDENCE OF VICKERS HARDNESS (Hv) | | | | | | | |
|---|---|---|---|---|---|---|---|
| substrate | VICKERS HARDNESS OF $B_xAl_{1-x}N_y$ FILMS | | | | | | |
| materials | 0.005 | 0.01 | 0.04 | 0.10 | 0.20 | 0.40 | 0.60 |
| WC-based cemented carbide | 2400 | — | 3000 | 2500 | — | — | — |
| $Al_2O_3$ | 2600 | — | 3500 | — | 3800 | 4200 | x |
| Si | 2400 | — | 3200 | — | — | — | — |
| AlN | — | — | — | — | — | 4400 | x |
| $Si_3N_4$ | — | 3000 | — | — | 3600 | — | — |

—: not examined
x: unmeasurable

Then the Vickers hardness Hv of the films is measured for some samples in table 1 by a weight of 10 g. Table 2 shows the results of the measurement. "—" means that the specimen is not examined. "x" indicates that the measurement is incapable for the specimen.

Traditional coating materials are TiN, TIC, AlN, $Al_2O_3$ and CrN. All the materials fail in giving a Vickers hardness higher than 3000 Hv. Thus, the materials which exhibit a hardness higher than 3000 Hv should be sought.

Table 2 teaches that doping of boron less than x=0.01 is useless for heightening the hardness over 3000 Hv. In general, the $B_xAl_{1-x}N_y$ films raise the hardness in proportion to an increase of boron concentration x. The phase transition from crystal into amorphism impairs the hardness. A rise of boron concentration induces the crystal- amorphism phase transition. Thus the highest x which is immune from the crystal-amorphism transition will give the highest hardness.

The WC-cemented carbide substrate gives 2500 Hv at x=0.10 to the BAlN film. The decrease is caused by the crystal-amorphism transition. The alumina substrate endows the BAlN film with 3800 Hv at x=0.20 in the crystal state. The same alumina substrate gives 4200 Hv at x=0.40. The AlN substrate exhibits 4400 Hv at x=0.40 in the crystalline state. This is the highest hardness among these specimens. The silicon nitride substrate realizes a hardness of 3600 at x=0.20. What gives a hardness more than 3000 Hv is $Al_2O_3$, AlN, $Si_3N_4$ and Si substrates.

[EMBODIMENT 11: (intermediate layer- dependence of x-parameters)]

Boron-aluminum nitride films are deposited on various intermediate layers formed on WC-based cemented carbide substrates heated at a proper temperature by the ion plating method (AlN) or the CVD method ($Al_2O_3$, $Si_3N_4$, TiN, TiC, SiC).

Figure 26:
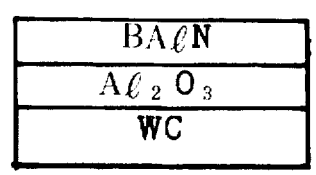
FIG. 26 is a simplified section of BAlN/Al$_2$O$_3$/WC which is one of the examples proposed by embodiment 11.

Thickness of intermediate layers 3 μm
Thickness of BAlN film 0.8 μm to 1.2 μm
x values 0.005, 0.01, 0.04, 0.10, 0.20, 0.40, 0.60
Substrate WC-based cemented carbide
Intermediate layer 1. aluminum oxide polycrystal (α-alumina) (α-$Al_2O_3$) (FIG. 26)

Figure 27:
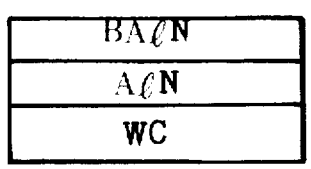
FIG. 27 is a simplified section of BAlN/AlN/WC which is one of the examples proposed by embodiment 11.
Figure 28:
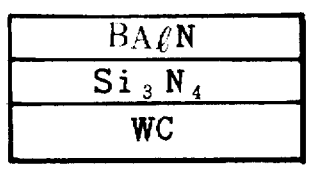
FIG. 28 is a simplified section of BAlN/Si$_3$N$_4$/WC which is one of the examples proposed by embodiment 11.
Figure 29:
FIG. 29 is a simplified section of BAlN/TiN/WC which is one of the examples proposed by embodiment 11.
Figure 30:
FIG. 30 is a simplified section of BAlN/TiC/WC which is one of the examples proposed by embodiment 11.
Figure 31:
FIG. 31 is a simplified section of BAlN/SiC/WC which is one of the examples proposed by embodiment 11.

2. aluminum nitride polycrystal (AlN) (FIG. 27)
3. silicon nitride polycrystal (Si$_3$N$_4$) (FIG. 28)
4. titanium nitride polycrystal (TiN) (FIG. 29)
5. titanium carbide polycrystal (TiC) (FIG. 30)
6. silicon carbide polycrystal (SiC) (FIG. 31)

Table 3 denotes the state of the B$_x$Al$_{1-x}$N$_y$ films which specified by the sorts of intermediate layers and the x-values (boron ratios). In the table 3, "○" means that the film becomes a wurtzite type hexagonal polycrystal of good crystallographical property. "Δ" denotes that the film becomes a wurtzite type hexagonal polycrystal of poor crystallographical property. "×" means that the film becomes amorphous and "–" indicates that the inventors did not experiment. The definition of the words "good" or "poor" is the same as Table 1.

TABLE 3

INTERMEDIATE FILM AND X-VALVE DEPENDENCE OF QUALITIES OF FILMS

| intermediate films | BORON RATIOS (x) IN B$_x$Al$_{1-x}$N$_y$ FILMS | | | | | | |
|---|---|---|---|---|---|---|---|
|  | 0.005 | 0.01 | 0.04 | 0.10 | 0.20 | 0.40 | 0.60 |
| Al$_2$O$_3$ | — | ○ | — | ○ | Δ | Δ | x |
| AlN | — | ○ | — | ○ | ○ | Δ | x |
| Si$_3$N$_4$ | ○ | ○ | Δ | x | x | x | — |
| TiN | ○ | ○ | ○ | Δ | x | — | — |
| TiC | ○ | ○ | ○ | Δ | x | — | — |
| SiC | ○ | ○ | ○ | ○ | ○ | — | — |

○: wurtzite type polycrystal (good quality)
Δ: wurtzite type polycrystal (poor quality)
x: amorphous
—: not examined The α-alumina intermediate layer (Al$_2$O$_3$) enables to make good wurtzite type B$_x$Al$_{1-x}$N$_y$ crystals up to x=0.10. The B$_x$Al$_{1-x}$N$_y$ film is still a wurtzite type crystal at x=0.20 and x=0.40, although the crystallography degrades. X=0.6 makes the B$_x$Al$_{1-x}$N$_y$ film amorphous. X=0.55 is the boundary between an amorphous state and a crystal state for the B$_x$Al$_{1-x}$N$_y$ films on α-alumina intermediate layer.

The AlN intermediate layer is capable of producing good wurtzite type B$_x$Al$_{1-x}$N$_y$ crystals at x=0.01, x=0.10 and x=0.20. The BAlN film is still a wurtzite type crystal at x=0.40. At x=0.6, the film becomes amorphous. The critical value is x=0.55 in the AlN intermediate film. AlN is one of the most promising materials as an intermediate film for the formation of B$_x$Al$_{1-x}$N$_y$ films.

The TiN intermediate layer on the WC substrate is capable of producing good wurtzite type B$_x$Al$_{1-x}$N$_y$ crystals from x=0.005 to x=0.04. X=0.10 degrades the property of the crystal. At x=0.20, the film becomes amorphous.

The TiC intermediate layer on the WC substrate is capable of producing good wurtzite type B$_x$Al$_{1-x}$N$_y$ crystals from x=0.005 to x=0.04. X=0.10 degrades the property of the crystal. At x=0.20, the film becomes amorphous.

The Si$_3$N$_4$ intermediate layer on the WC substrate is capable of producing good wurtzite type B$_x$Al$_{1-x}$N$_y$ crystals from x=0.005 to x=0.01. X=0.04 degrades the property of the crystal. At x=0.10, the film becomes amorphous.

The SiC intermediate layer on the WC substrate can produce good wurtzite type B$_x$Al$_{1-x}$N$_y$ crystals at x=0.005, x=0.01, x=0.04, x=0.10 and x=0.20.

The results shows a strong influence of the intermediate films and the x-values on the crystalline property of B$_x$Al$_{1-x}$N$_y$. The other value y also affects the property of B$_x$Al$_{1-x}$N$_y$. Optimum range of y is from y=0.94 to y=1.01. Suitable scope of y ranges from y=0.85 to y=1.05. In any cases, B$_x$Al$_{1-x}$N$_y$ becomes amorphous both in y<0.85 or in y>1.05.

Then the Vickers hardness Hv of the films is measured for some samples in table 3 by a weight of 10 g. Table 4 shows the results of the measurement. "–" means that the specimen is not examined. "×" indicates that the measurement is incapable for the specimen.

Table 4 teaches that doping of boron less than x=0.01 is useless for heightening the hardness over 3000 Hv. In the case of utilizing intermediate layers, the B$_x$Al$_{1-x}$N$_y$ films raise the hardness in proportion to an increase of boron concentration x. The phase transition from crystal into amorphism impairs the hardness. A rise of boron concentration induces the crystal-amorphism phase transition also on the intermediate layers. Thus, the highest x which is immune from the crystal-amorphous transition will give the highest hardness.

TABLE 4

INTERMEDIATE FILM AND X-VALVE DEPENDENCE OF VICKERS HARDNESS (Hv)

| intermediate films | BORON RATIOS (X) IN B$_x$Al$_{1-x}$N$_y$ FILMS | | | | | | |
|---|---|---|---|---|---|---|---|
|  | 0.005 | 0.01 | 0.04 | 0.10 | 0.20 | 0.40 | 0.60 |
| Al$_2$O$_3$ | — | — | — | 3400 | 3600 | 3800 | — |
| AlN | — | 3000 | — | — | 3800 | 4000 | — |
| Si$_3$N$_4$ | — | — | x | — | — | — | — |
| TiN | — | — | 3200 | 3100 | x | — | — |
| TiC | — | — | 2800 | — | — | — | — |

—: not examined
x: unmeasurable

The TiC intermediate layer gives 2800 Hv at x=0.04 which is lower than the aforementioned critical value of 3000 Hv. The TiN intermediate layer gives 3200 Hv at x=0.04 and 3100 Hv at x=0.10, which are slightly over 3000 Hv.

The alumina intermediate layer endows 3400 Hv at x=0.10, 3600 Hv at x=0.20 in the crystal state. The same alumina intermediate layer gives 3800 Hv at x=0.40.

The AlN intermediate layer exhibits 3800 Hv at x=0.20 in the crystalline state. The AlN layer gives 4000 Hv at x=0.40 in amorphism. This is the highest hardness among these specimens with intermediate layers.

[EMBODIMENT 12: (BAlN/Al$_2$O$_3$) (FIG. 32)]

A boron-aluminum nitride film is formed on an Al$_2$O$_3$ sintering substrate from boron trichloride (BCl$_3$), aluminum trichloride (AlCl$_3$) and ammonia (NH$_3$) in the capacitance-coupling type plasma CVD apparatus under the following conditions.

| Apparatus | radio-frequency plasma CVD apparatus | |
|---|---|---|
| Substrate | sintered Al$_2$O$_3$ | |
| Material gas | BCl$_3$ + Ar (carrier) | 20 sccm |
|  | AlCl$_3$ + Ar (carrier) | 60 sccm |
|  | ammonia gas (NH$_3$) | 200 sccm |
|  | hydrogen gas (H$_2$) | 2000 sccm |
| Pressure |  | 300 Pa |
| Substrate temperature |  | 1050° C. |
| Electric power |  | 350 W |
| Frequency |  | 13.56 MHz |
| Deposition time |  | 120 min |
| BAlN film thickness |  | 1.5 μm |

The film is estimated by the X-ray diffraction method using Cu Kα line(0.154 nm). The X-ray diffraction pattern confirms that the BAlN film has the wurtzite type crystal structure.

Figure 5:
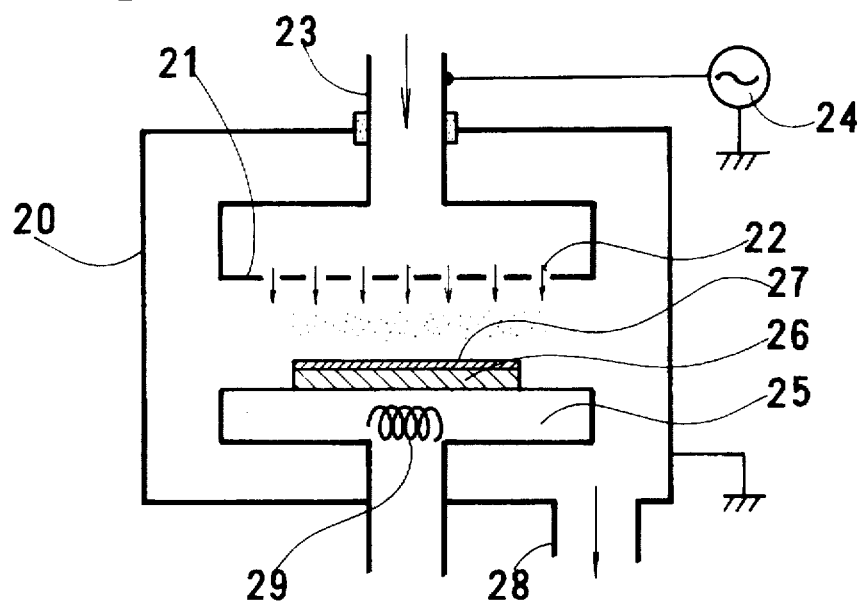
FIG. 5 is a schematic section of a plasma CVD apparatus.

FIG. 5 indicates a capacitance-coupling plasma CVD apparatus. A reaction chamber (20) contains a counterpart electrode (21) and a susceptor (25). A radio frequency power source (24) applies a rf-voltage between the counterpart electrode (21) and the susceptor (25). Material gases are introduced into the chamber (20) via a gas inlet (23) and through small holes (22) of the counterpart electrode (21). A substrate (26) is laid on the susceptor (25). A heater (29) heats the substrate (26). The material gases are excited into plasma by the rf-electric power. Vapor phase reactions are induced by the plasma. A film (27) is grown on the substrate.

Figure 32:
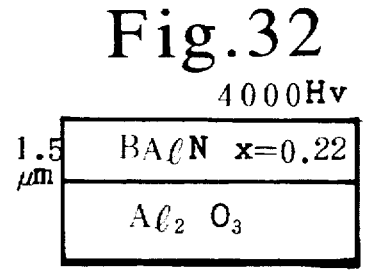
FIG. 32 is a simplified section of BAlN/Al$_2$O$_3$ of embodiment 12.

FIG. 32 shows the section of embodiment 12. The X-ray diffraction measurement reveals that the BAlN film is polycrystal of random orientation. The peak corresponding to the diffraction from (100) planes appears at 2θ=34.5 degrees in the θ–2θ scanning. The FWHM at the peak generated by the diffraction from (100) planes is 0.4 degree. The boron ratio in the BAlN film is x=0.22. The hardness of the film is 4000 Hv. This is a very hard film.

Figure 33:
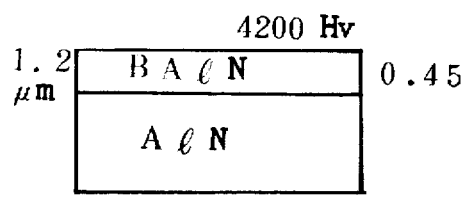
FIG. 33 is a simplified section of BAlN/AlN of embodiment 13.

[EMBODIMENT 13:(BAlN/AlN: FIG. 33)]

Figure 6:
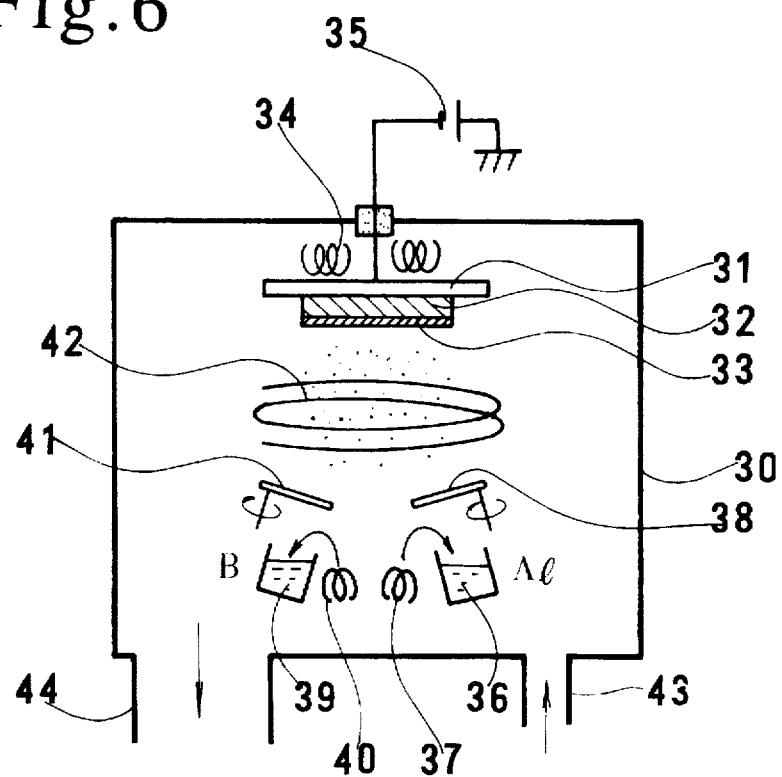
FIG. 6 is a schematic section of an ion plating apparatus.
Figure 7:
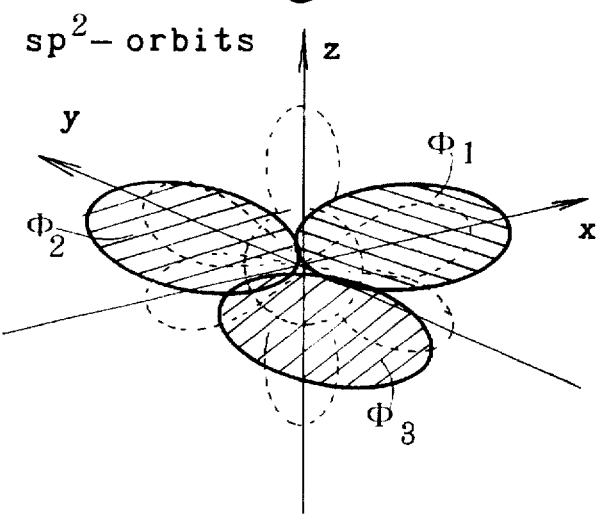
FIG. 7 is an explanatory figure of $sp^2$-hybridization.
Figure 8:
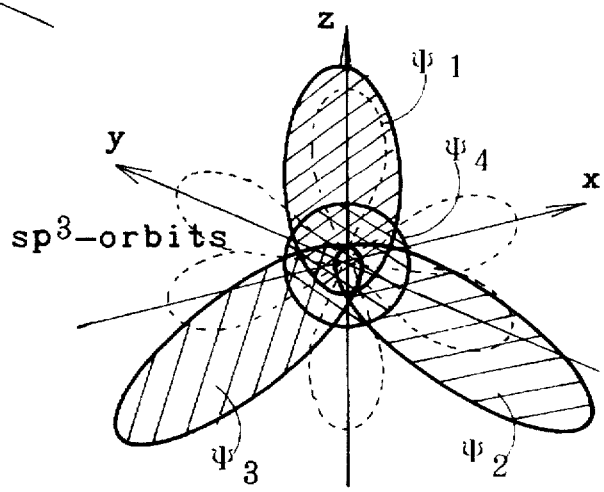
FIG. 8 is an explanatory figure of $sp^3$-hybridization.

An boron-aluminum nitride film is grown on an aluminum nitride sintering substrate by the ion plating method. FIG. 6 shows an ion plating apparatus. A reaction chamber (30) contains susceptor (31), a crucible (36), another crucible (39) and a coil (42). A substrate (32) is held on the susceptor (31) and heated by a heater (34). The susceptor (31) is negatively biased by a power source (35). Metal aluminum is stored in hecrucible (36). Metal boron is filled in the other crucible (39). An electron gun (37) launches electron beams into the crucible (36). Aluminum is heated and evaporated. Boron is also heated by the electron beams from the gun (40). Shutters (38) and (41) control aluminum beams and boron beams. The coil (42) generates rf-electric fields for enhancing the materials into ions. Gaseous materials are introduced into the chamber (30) through a gas inlet (43). The waste gas is exhausted through an outlet (44).

A BAlN film is grown on the AlN substrate by evaporating both aluminum and boron simultaneously on the following conditions.

| Apparatus | ion plating apparatus |
|---|---|
| Substrate | sintered AlN |
| Materials | metal aluminum (Al) |
| | metal boron (B) |
| | nitrogen gas (N$_2$) |
| Pressure | 0.5 Pa |
| Substrate temperature | 800° C. |
| RF-power | 100 W |
| Reaction time | 50 min |
| Film thickness | 1.2 μm |

The film (FIG. 33) is examined by the X-ray diffraction. The measurement confirms that the film has the wurtzite type structure in hexagonal symmetry. The boron ratio is x=0.45 according to the X-ray photoelectron spectrometry. The FWHM is 0.7 degree at the peak of the diffraction from (100) planes in the θ–2θ scanning. The Vickers hardness is 4200 Hv. High x-value (x=0.45) and good crystal property (FWHM=0.7) bring about excellent hardness.

Figure 34:
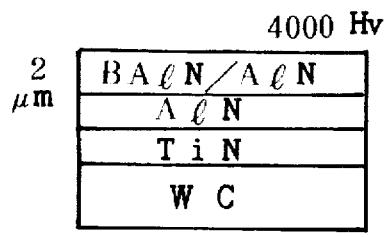
FIG. 34 is a simplified section of (BAlN/AlN)/TiN/WC of embodiment 14.

[EMBODIMENT 14:(BAlN/AlN/AlN/TiN/WC):FIG. 34]

An intermediate TiN layer, AlN layer and an assembly of BAlN and AlN thin films are produced on a WC-based cemented carbide substrate by the ion plating method by the following conditions.

| Apparatus | ion plating apparatus |
|---|---|
| Substrate | WC-based cemented carbide |
| Materials | metal aluminum (Al) |
| | metal boron (B) |
| | metal titanium (Ti) |
| | nitrogen gas (N$_2$) |
| Pressure | 0.3 Pa |
| Substrate temperature | 750° C. |
| Substrate bias | −300 V |
| RF-power | 50 W |
| (1) First step | Ti evaporation |
| TiN film formation | 50 nm |
| (2) Second step | Al evaporation |
| AlN formation | 100 nm |
| (3) Third step | Al continual evaporation |
| | B intermittent evaporation |

(Shutter for boron is closed and opened at intervals of 30 sec opening and 30 sec closing of a 60 sec period.)
BAlN/AlN/BAlN/AlN/···/BAlN/AlN formation 2 μm The top film is an assembly of AlN layers and BAlN layers. A BAlN layer is sandwiched between two AlN layers. An AlN layer is also sandwiched between two BAlN layers. FIG. 3 shows such a multilayered film. The distributed AlN thin films relax the inner strain and heighten the crystal property. The reinforcing film AlN can be replaced with Al$_2$O$_3$ or Si$_3$N$_4$. The BAlN/AlN multifilm exhibits a Vickers hardness 4000.

What we claim is:

1. A boron-aluminum nitride coating comprising:
   a substrate and
   a boron-aluminum nitride film having a composition of B$_x$Al$_{1-x}$N$_y$ (0.001≦x≦0.7, 0.85≦y≦1.05) forming a wurtzite type crystal structure of hexagonal symmetry and having a thickness between 10 nm and 50 μm.

2. A boron-aluminum nitride coating as claimed in claim 1, wherein the substrate is a molybdenum (Mo) crystal, a tungsten (W) crystal, a nickel (Ni) crystal, a tantalum (Ta) crystal, or a niobium (Nb) crystal.

3. A boron-aluminum nitride coating as claimed in claim 1, wherein the substrate is a diamond (C) crystal, a silicon (Si) crystal, a germanium (Ge) crystal, an aluminum nitride (AlN) crystal, a gallium nitride (GaN) crystal, a silicon carbide (SIC) crystal, a boron phosphide (BP) crystal or an indium nitride (InN) crystal.

4. A boron-aluminum nitride coating as claimed in claim 1, wherein the substrate is an aluminum oxide (α-Al$_2$O$_3$) crystal, a silicon dioxide (SiO$_2$) crystal, a magnesium oxide (MgO) crystal, a beryllium oxide (BeO) crystal or a silicon nitride (Si$_3$N$_4$) crystal.

5. A boron-aluminum nitride coating as claimed in claim 1, wherein the boron-aluminum nitride film is a c-axis oriented polycrystal or a single crystal.

6. A boron-aluminum nitride coating as claimed in claim 5, wherein the substrate is a diamond (C) single crystal, a silicon (Si) single crystal, a cubic silicon carbide (c-SiC) single crystal or a magnesium oxide (MgO) single crystal.

7. A boron-aluminum nitride coating as claimed in claim 6, wherein the boron-aluminum nitride film is made on a (111) plane of a cubic single crystal.

8. A boron-aluminum nitride coating as claimed in claim 5, wherein the substrate is a sapphire (α-Al$_2$O$_3$) single crystal or a hexagonal silicon carbide (h-SiC) single crystal.

9. A boron-aluminum nitride coating as claimed in claim 8, wherein the boron-aluminum nitride film is made on a (0001) plane of a hexagonal single crystal substrate.

10. A boron-aluminum nitride coating comprising:
    a single crystal substrate;
    a single crystal intermediate layer and a boron-aluminum nitride single crystal top layer.

11. A boron-aluminum nitride coating as claimed in claim 10, wherein the boron-aluminum nitride single crystal film has a composition of $B_xAl_{1-x}N_y$ ($0.001 \leq x \leq 0.3$, $0.85 \leq y \leq 1.05$), forms a wurtzite type crystal structure of hexagonal symmetry and has a thickness between 10 nm and 50 μm.

12. A boron-aluminum nitride coating as claimed in claim 10, wherein the intermediate layer is an aluminum nitride (AlN) single crystal with a thickness from 1 nm to 1 μm.

13. A boron-aluminum nitride coating as claimed in claim 10, wherein the substrate is a diamond (C) single crystal, a silicon (Si) single crystal, a cubic silicon carbide (c-SiC) single crystal or a magnesium oxide (MgO) single crystal.

14. A boron-aluminum nitride coating as claimed in claim 13, wherein the intermediate layer is made on (111) plane of a cubic single crystal substrate.

15. A boron-aluminum nitride coating as claimed in claim 10, wherein the substrate is a sapphire ($\alpha$-$Al_2O_3$) single crystal or a hexagonal silicon carbide (h-SiC) single crystal.

16. A boron-aluminum nitride coating as claimed in claim 15, wherein the intermediate layer is made on a (0001) plane of a hexagonal single crystal substrate.

17. A boron-aluminum nitride coating comprising:

a single crystal substrate;

a boron-aluminum nitride single crystal intermediate layer with sublayers of gradient B/Al compositions changing stepwise or continually and a boron-aluminum nitride top layer.

18. A boron-aluminum nitride coating as claimed in claim 17, wherein the sublayers of the intermediate boron-aluminum nitride single crystal layer have compositions of $B_xAl_{1-x}N_y$ ($0.0001 \leq x_m \leq x \leq x_n \leq x_0$, $0.85 \leq y \leq 1.05$) changing stepwise or continually from $x=x_m$ to $x=x_n$, have a thickness from 1 nm to 1 μm and form a wurtzite type crystal structure of hexagonal symmetry, and the boron-aluminum nitride single crystal top film has a composition of $B_{x0}Al_{1-x0}N_y$ ($0.001 \leq x_0 \leq 0.70$, $0.85 \leq y \leq 1.05$), has a thickness between 10 nm and 50 μm and forms a wurtzite type crystal structure of hexagonal symmetry.

19. A boron-aluminum nitride coating as claimed in claim 18, wherein the substrate is a diamond single crystal, a silicon (Si) single crystal, a cubic silicon carbide (c-SiC) single crystal or a magnesium oxide (MgO) single crystal.

20. A boron-aluminum nitride coating as claimed in claim 19, wherein the intermediate layer is made on a (111) plane of the single crystal substrate.

21. A boron-aluminum nitride coating as claimed in claim 20, wherein the substrate is a sapphire ($\alpha$-$Al_2O_3$) single crystal or a hexagonal silicon carbide (h-SiC) single crystal.

22. A boron-aluminum nitride coating as claimed in claim 21, wherein the intermediate layer is made on a (0001) plane of the single crystal substrate.

23. A boron-aluminum nitride coating comprising:

a single crystal substrate;

an aluminum nitride (AlN) single crystal first intermediate layer;

a boron-aluminum nitride single crystal second intermediate layer with sublayers of gradient B/Al compositions changing stepwise or continually and a boron-aluminum nitride single crystal top layer.

24. A boron-aluminum nitride coating as claimed in claim 23, wherein the sublayers of the intermediate boron-aluminum single crystal layer have compositions of $B_xAl_{1-x}N_y$ ($0.0001 \leq x_m \leq x \leq x_n \leq x_0$, $0.85 \leq y \leq 1.05$) changing stepwise or continually from $x=x_m$ to $x=x_n$, have a thickness from 1 nm to 1 μm and form a wurtzite type crystal structure of hexagonal symmetry, and the boron-aluminum nitride single crystal top film has a composition of $B_{x0}Al_{1-x0}N_y$ ($0.001 \leq x_0 \leq 0.70$, $0.85 \leq y \leq 1.05$), has a thickness between 10 nm and 50 μm and forms a wurtzite type crystal structure of hexagonal symmetry, the top film having a thickness between 10 nm and 50 μm.

25. A boron-aluminum nitride coating as claimed in claim 24, wherein the substrate is a diamond single crystal, a silicon (Si) single crystal, a cubic silicon carbide (c-SiC) single crystal or a magnesium oxide (MgO) single crystal.

26. A boron-aluminum nitride coating as claimed in claim 25, wherein the intermediate layer is made on a (111) plane of the single crystal substrate.

27. A boron-aluminum nitride coating as claimed in claim 26, wherein the substrate is a sapphire ($\alpha$-$Al_2O_3$) single crystal or a hexagonal silicon carbide (h-SiC) single crystal.

28. A boron-aluminum nitride coating as claimed in claim 27, wherein the intermediate layer is made on a (0001) plane of the single crystal substrate.

29. A boron-aluminum nitride film having a composition of $B_xAl_{1-x}N_y$ ($0.001 \leq x \leq 0.55$, $0.85 \leq y \leq 1.05$), forming a wurtzite type crystal structure or hexagonal symmetry and having a thickness between 1 nm and 50 μm.

30. A boron-aluminum nitride coated member comprising:

a hard substrate member;

hard films deposited on the substrate member, having a composition of $B_xAl_{1-x}N_y$ ($0.0001 \leq x \leq 0.55$, $0.85 \leq y \leq 1.05$), forming a wurtzite type crystal structure of hexagonal symmetry, each film having a thickness between 1 nm and 50 μm, a sum of the thickness of all films ranging from 0.5 μm to 50 μm.

31. A boron-aluminum nitride coated member as claimed in claim 30, wherein the substrate member has at least one intermediate layer comprising a carbide, a nitride, an oxide, a boride, diamond or a solid-solution of a carbide, a nitride, a boride or diamond between the substrate member itself and the hard films.

32. A boron-aluminum nitride coated member as claimed in claim 31, wherein at least one said intermediate layer is aluminum nitride (AlN), aluminum oxide ($Al_2O_3$), silicon nitride ($Si_3N_4$) or silicon carbide (SiC).

33. A boron-aluminum nitride coated member as claimed in claim 30, wherein the substrate member comprises a nitride, a carbide, an oxide, a boride of a transition metal belonging to the periodic table group IVa, Va or VIa, a solid solution thereof or diamond.

* * * * *